US010439562B2

(12) United States Patent
Tokuda et al.

(10) Patent No.: US 10,439,562 B2
(45) Date of Patent: Oct. 8, 2019

(54) CURRENT MIRROR BIAS COMPENSATION CIRCUIT

(71) Applicant: pSemi Corporation, San Diego, CA (US)

(72) Inventors: Ikumi Tokuda, Kyoto (JP); Tero Tapio Ranta, San Diego, CA (US); Keith Bargroff, San Diego, CA (US); Christopher C. Murphy, Lake Zurich, IL (US); Robert Mark Englekirk, Littleton, CO (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/908,354

(22) Filed: Feb. 28, 2018

(65) Prior Publication Data

US 2018/0262163 A1    Sep. 13, 2018

Related U.S. Application Data

(63) Continuation-in-part of application No. 15/445,811, filed on Feb. 28, 2017, now Pat. No. 10,056,874.

(51) Int. Cl.
*H03F 1/30* (2006.01)
*H03F 3/19* (2006.01)
(Continued)

(52) U.S. Cl.
CPC ............... *H03F 1/30* (2013.01); *G05F 3/26* (2013.01); *H03F 1/56* (2013.01); *H03F 3/19* (2013.01);
(Continued)

(58) Field of Classification Search
USPC ................................. 330/285, 296, 288–289
See application file for complete search history.

(56) References Cited

U.S. PATENT DOCUMENTS

| 4,749,889 A | 6/1988 | Lagoni et al. |
| 6,297,696 B1 | 10/2001 | Abdollahian et al. |

(Continued)

FOREIGN PATENT DOCUMENTS

| EP | 1615337 | 1/2006 |
| WO | 2009108391 | 9/2009 |

(Continued)

OTHER PUBLICATIONS

Nguyen, Hieu P., Office Action received from the USPTO dated Jan. 30, 2018 for U.S. Appl. No. 15/445,811, 6 pgs.

(Continued)

*Primary Examiner* — Hieu P Nguyen
(74) *Attorney, Agent, or Firm* — Jaquez Land Greenhaus LLP; John Land, Esq.

(57) ABSTRACT

Temperature compensation circuits and methods for adjusting one or more circuit parameters of a power amplifier (PA) to maintain approximately constant Gain versus time during pulsed operation sufficient to substantially offset self-heating of the PA. Some embodiments compensate for PA Gain "droop" due to self-heating using a Sample and Hold (S&H) circuit. Other embodiments include bias compensation circuits that directly regulate a bias signal to an amplifier stage as a function of localized heating of one or more of amplifier stages. Such bias compensation circuits include physical placement of at least one bias compensation circuit element in closer proximity to at least one amplifier stage than other bias compensation circuit elements. One bias compensation circuit embodiment includes a temperature-sensitive current mirror circuit for regulating the bias signal. Another bias compensation circuit embodiment includes a temperature-sensitive element having a positive temperature coefficient (PTC) for regulating the bias signal.

13 Claims, 26 Drawing Sheets

Current Mirror Bias Correction Circuit

(51) Int. Cl.
- H03F 3/21 (2006.01)
- G05F 3/26 (2006.01)
- H03F 1/56 (2006.01)
- H03F 3/195 (2006.01)
- H03F 3/24 (2006.01)
- H04B 1/04 (2006.01)

(52) U.S. Cl.
CPC ............. *H03F 3/195* (2013.01); *H03F 3/21* (2013.01); *H03F 3/245* (2013.01); *H03F 2200/129* (2013.01); *H03F 2200/408* (2013.01); *H03F 2200/411* (2013.01); *H03F 2200/447* (2013.01); *H03F 2200/451* (2013.01); *H03F 2200/468* (2013.01); *H04B 1/04* (2013.01); *H04B 2001/0408* (2013.01)

(56) References Cited

U.S. PATENT DOCUMENTS

| | | | |
|---|---|---|---|
| 6,392,490 B1 | 5/2002 | Gramegna et al. | |
| 6,731,171 B2 | 5/2004 | Yamashita | |
| 6,804,502 B2 | 10/2004 | Burgener et al. | |
| 6,831,504 B1 | 12/2004 | Holloway et al. | |
| 7,248,120 B2 | 7/2007 | Burgener et al. | |
| 7,276,976 B2 | 10/2007 | Oh et al. | |
| 7,649,418 B2 | 1/2010 | Matsui | |
| 7,656,233 B2 | 2/2010 | Lee | |
| 7,737,790 B1 | 6/2010 | Chen et al. | |
| 7,859,243 B2 | 12/2010 | Lorenz | |
| 7,910,993 B2 | 3/2011 | Brindle et al. | |
| 8,022,755 B2* | 9/2011 | Gomez | H03G 5/28 330/2 |
| 8,487,706 B2 | 7/2013 | Li et al. | |
| 9,083,287 B2 | 7/2015 | Papamichail | |
| 9,148,088 B1 | 9/2015 | Ding | |
| 9,178,493 B1 | 11/2015 | Nobbe | |
| 9,219,445 B2 | 12/2015 | Nobbe et al. | |
| 9,231,528 B2* | 1/2016 | Granger-Jones | H03F 1/302 |
| 9,276,527 B2 | 3/2016 | Gaynor | |
| 9,294,056 B2 | 3/2016 | Nobbe et al. | |
| 9,331,643 B2 | 5/2016 | Gaynor | |
| 9,413,298 B2 | 8/2016 | Nobbe et al. | |
| 9,419,565 B2 | 8/2016 | Nobbe et al. | |
| 9,503,026 B2 | 11/2016 | Lam et al. | |
| 9,509,263 B2 | 11/2016 | Lam | |
| 9,595,923 B2 | 3/2017 | Nobbe et al. | |
| 9,602,063 B2 | 3/2017 | Kaatz et al. | |
| 9,641,141 B1 | 5/2017 | Zheng et al. | |
| 9,647,631 B2 | 5/2017 | Gaynor | |
| 9,837,965 B1 | 12/2017 | Wagh et al. | |
| 9,843,293 B1 | 12/2017 | Wagh et al. | |
| 9,874,893 B2 | 1/2018 | Ciubotaru | |
| 9,882,531 B1 | 1/2018 | Willard et al. | |
| 10,056,874 B1 | 8/2018 | Ranta et al. | |
| 10,305,433 B2 | 5/2019 | Ranta et al. | |
| 2002/0074499 A1 | 6/2002 | Butler | |
| 2003/0137355 A1 | 7/2003 | Lin | |
| 2005/0029453 A1 | 2/2005 | Allen et al. | |
| 2008/0284519 A1 | 11/2008 | Andrews | |
| 2009/0258611 A1 | 10/2009 | Nakamura et al. | |
| 2011/0279178 A1 | 11/2011 | Outaleb et al. | |
| 2011/0298538 A1 | 12/2011 | Andrys et al. | |
| 2013/0222075 A1 | 8/2013 | Reedy et al. | |
| 2013/0229231 A1 | 9/2013 | Tanaka et al. | |
| 2014/0097698 A1 | 4/2014 | Wang et al. | |
| 2014/0184335 A1 | 7/2014 | Nobbe et al. | |
| 2014/0184337 A1 | 7/2014 | Nobbe et al. | |
| 2014/0266460 A1 | 9/2014 | Nobbe et al. | |
| 2015/0077185 A1 | 3/2015 | Ding et al. | |
| 2015/0077187 A1 | 3/2015 | Lam et al. | |
| 2015/0270806 A1 | 9/2015 | Wagh et al. | |
| 2015/0326206 A1 | 11/2015 | Nobbe | |
| 2015/0326326 A1 | 11/2015 | Nobbe et al. | |
| 2018/0083578 A1 | 3/2018 | Klaren | |
| 2018/0115287 A1 | 4/2018 | Rabjohn et al. | |
| 2018/0262164 A1 | 9/2018 | Ranta et al. | |
| 2018/0262166 A1 | 9/2018 | Takagi et al. | |
| 2018/0316327 A1 | 11/2018 | Ranta et al. | |
| 2019/0173433 A1 | 6/2019 | Ranta et al. | |

FOREIGN PATENT DOCUMENTS

| | | |
|---|---|---|
| WO | 2012082445 | 6/2012 |
| WO | 2018160771 | 9/2018 |

OTHER PUBLICATIONS

Nguyen, Hieu P., Notice of Allowance received from the USPTO dated May 23, 2018 for U.S. Appl. No. 15/445,811, 22 pgs.

Ranta, et al., Preliminary Amendment filed in the USPTO dated Oct. 16, 2017 for U.S. Appl. No. 15/445,811, 20 pgs.

Ranta, et al., Response filed in the USPTO dated Feb. 9, 2018 for U.S. Appl. No. 15/445,811, 10 pgs.

Nguyen, Lee, Notice of Allowance received from the USPTO dated Jul. 31, 2017 for U.S. Appl. No. 14/272,415, 13 pgs.

Nguyen, Patricia T., Office Action received from the USPTO dated Dec. 11, 2017 for U.S. Appl. No. 15/268,229, 6 pgs.

Nguyen, Patricia T., Office Action received from the USPTO dated May 3, 2018 for U.S. Appl. No. 15/268,229, 34 pgs.

Klaren, et al., Preliminary Amendment filed in the USPTO dated Nov. 29, 2016 for U.S. Appl. No. 15/268,229, 11 pgs.

Klaren, et al., Response filed in the USPTO dated Jan. 29, 2018 for U.S. Appl. No. 15/268,229, 7 pgs.

Klaren, et al., Response filed in the USPTO dated Jul. 17, 2018 for U.S. Appl. No. 15/268,229, 10 pgs.

Wienema, David, International Search Report and Written Opinion received from the EPO dated Aug. 31, 2017 for appln. No. PCT/US2017/044015, 19 pgs.

Ranta, et al., "Power Amplifier Self-Heating Compensation Circuit", application filed in the USPTO dated Feb. 28, 2018, U.S. Appl. No. 15/908,533, 76 pgs.

Takagi, et al., "Positive Temperature Coefficient Bias Compensation Circuit", application filed in the USPTO dated Feb. 28, 2018, U.S. Appl. No. 15/908,469, 59 pgs.

Gundlach, Susanne, Invitation to Pay Additional Fees and, Where Applicable, Protest Fee received from the EPO dated Jun. 15, 2018 for appln. No. PCT/US2018/020332, 13 pgs.

Nguyen, Hieu P., Office Action received from the USPTO dated Sep. 14, 2018 for U.S. Appl. No. 15/908,469, 18 pgs.

Nguyen, Hieu P., Office Action received from the USPTO dated Oct. 12, 2018 for U.S. Appl. No. 15/908,533, 6 pgs.

Mouanda, Thierry, International Search Report and Written Opinion received from the EPO dated Sep. 21, 2018 for appln. No. PCT/US2018/020332, 21 pgs.

Nguyen, Hieu P., Office Action received from the USPTO dated Nov. 9, 2018 for U.S. Appl. No. 16/025,873, 5 pgs.

Nguyen, Hieu P., Office Action received from the USPTO dated Feb. 15, 2019 for U.S. Appl. No. 16/025,873, 18 pgs.

Mouanda, Thierry, Invitation to Restrict or Pay Additional Fees, and, Where Applicable, Protest Fee received from the EPO dated Mar. 5, 2019 for appln. No. PCT/US2018/020332, 4 pgs.

Nguyen, Hieu P., Notice of Allowance received from the USPTO dated Apr. 2, 2019 for U.S. Appl. No. 15/908,533, 16 pgs.

Nguyen, Hieu P., Office Action received from the USPTO dated Jan. 7, 2019 for U.S. Appl. No. 15/908,533, 27 pgs.

Nguyen, Hieu P., Final Office Action received from the USPTO dated Jan. 14, 2019 for U.S. Appl. No. 15/908,469, 17 pgs.

Mouanda, Thierry, Written Opinion received from the EPO dated May 15, 2019 for appln. No. PCT/US2018/020332, 8 pgs.

Nguyen, Hieu P., Notice of Allowance received from the USPTO dated Jun. 7, 2019 for appln. No. 15/908,469, 14 pgs.

Nguyen, Hieu P., Notice of Allowance received from the USPTO dated Jul. 11, 2019 for appln. No. 16/025,873, 23 pgs.

* cited by examiner

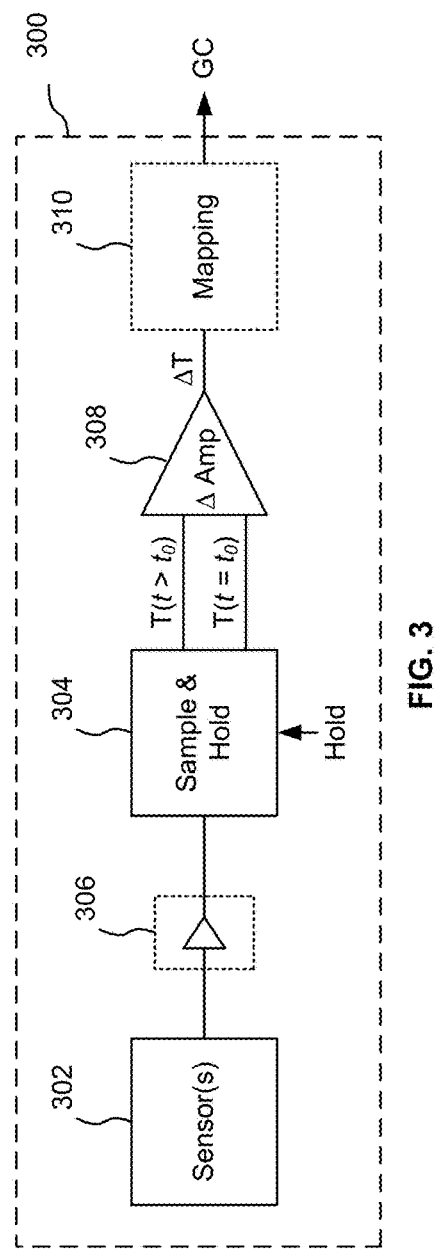
FIG. 3
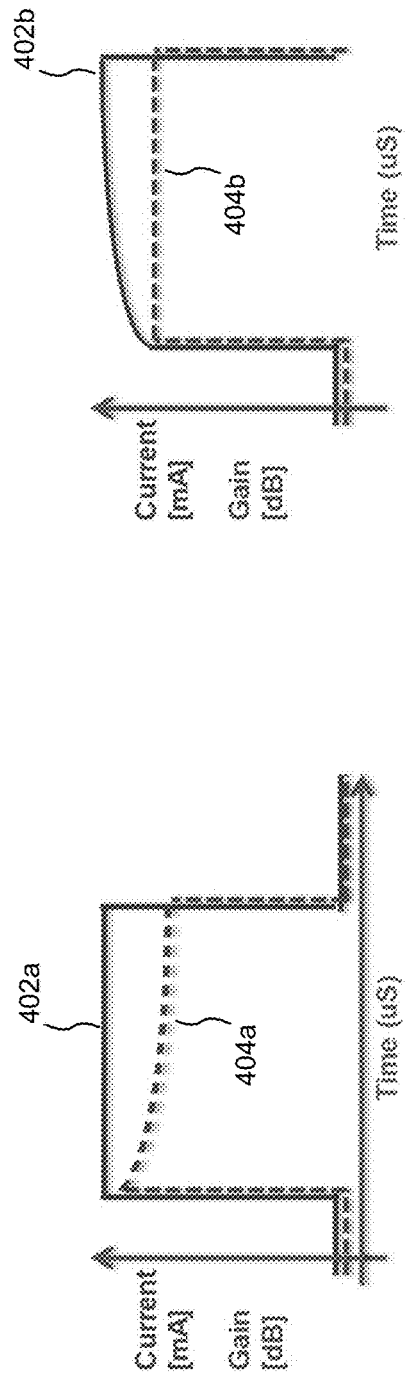
FIG. 4A (Prior Art)
FIG. 4B

1240

Providing at least one scaled replica amplifier in close proximity to the power amplifier, each scaled replica amplifier having an input coupled to a reference signal and outputting an amplified reference signal, wherein each scaled replica amplifier has a corresponding Gain that droops due to self-heating of the power amplifier during pulsed operation of the power amplifier — 1242

Providing a power measurement and correction circuit coupled to the reference signal and to the amplified reference signal, for determining a correction signal as a function of the reference signal and of the amplified reference signal, the correction signal being coupled to the power amplifier to adjust the Gain of the power amplifier sufficient to substantially offset the effect of self-heating of the power amplifier on the Gain of the power amplifier during pulsed operation of the power amplifier — 1244

FIG. 12E

Two-Stage RF Amplifier
(Prior Art)

Current Mirror Bias Correction Circuit

Current Mirror Bias Correction Circuit Detail

Current Mirror Bias Correction Circuit with Amplified Difference Current

Positive Temp Coefficient Bias Correction Circuit

*1900*

```
┌─────────────────────────────────────┐
│ Providing one or more amplifier     │
│ stages, each having a corresponding │
│ bias circuit configured to output a │──── 1902
│ corresponding bias current to the   │
│ corresponding amplifier stage       │
└─────────────────────────────────────┘
                  │
                  ▼
┌─────────────────────────────────────┐
│ Coupling at least one bias          │
│ compensation circuit to at least    │
│ one of the bias circuits, the at    │
│ least one bias compensation circuit │
│ including a current mirror circuit  │
│ having a 1st transistor coupled to  │
│ a 1st constant current source and   │
│ positioned at a distance d1 from a  │
│ specific one of the one or more     │
│ amplifier stages, and a 2nd         │──── 1904
│ transistor coupled to a 2nd         │
│ constant current source and         │
│ positioned at a distance d2 from    │
│ that specific one amplifier stage,  │
│ wherein d1 < d2, and each bias      │
│ compensation circuit regulates the  │
│ corresponding bias current output   │
│ by the coupled bias circuits as a   │
│ function of the temperature of the  │
│ 1st transistor relative to the      │
│ temperature of the 2nd transistor   │
└─────────────────────────────────────┘
```

FIG. 19

CURRENT MIRROR BIAS COMPENSATION CIRCUIT

CROSS-REFERENCE TO RELATED APPLICATIONS

The present application is a continuation-in-part of, and claims priority to, co-pending and commonly assigned U.S. patent application Ser. No. 15/445,811, filed Feb. 28, 2017, entitled "Power Amplifier Self-Heating Compensation Circuit", the entire contents of each of which are incorporated herein by reference.

The present application may be related to U.S. patent application Ser. No. 14/272,415, filed May 7, 2014, entitled "Mismatch Detection Using Replica Circuit", and U.S. patent application Ser. No. 15/268,229, filed Sep. 16, 2016, entitled "Cascode Amplifier Bias Circuits", both of which are assigned to the assignee of the present invention, the entire contents of each of which are incorporated herein by reference.

BACKGROUND

(1) Technical Field

This invention relates to electronic circuitry, and more particularly to electronic radio frequency amplifier circuits and methods.

(2) Background

Power amplifiers (PAs) are used in a multitude of electronic systems, particularly radio frequency (RF) systems, such as radios, cellular telephones, WiFi, etc. In a number of radio systems, communication of RF signals is based on time division duplexing (TDD), in which multiple radio transceivers utilize designated time slots within a frequency band to transmit or receive signals. When transmitting a signal in such systems, an RF transceiver PA is operated in a pulsed mode, amplifying an applied RF signal only during each designated time slot, and being powered OFF at other times.

FIG. 1 is a block diagram of a typical prior art radio transmitter two-stage power amplifier 100. In the illustrated example, an integrated circuit (IC) 102 includes several subcircuits that accept an RF input signal RFin and generate an amplified output signal RFout to a selected destination (e.g., one or more band filters and/or antenna ports); the IC 102 may also be referred to as a "chip" or "die".

In the illustrated example, an input impedance matching network (IMN) 104 impedance matches the input signal RFin to a first amplifier stage 106 (often called a driver). An interstage IMN 108 couples the output of the first amplifier stage 106 to a second amplifier stage 110 (in this case, a final stage). The amplified RF output of the second amplifier stage 110 is coupled to an output IMN 112, the output of which is RFout. The PA 100 example shown in FIG. 1 has two amplifier stages, but other embodiments may have fewer or more than two amplifier stages. One or more of the various IMN circuits 104, 108, 112 may be implemented in a tunable configuration, such as by using tunable inductors and/or tunable capacitors; some of the IMN circuits may be optional for some embodiments; and in some embodiments, one or more of the IMN circuits may be off-chip circuits.

In the illustrated example, the first amplifier stage 106 and the final amplifier stage 110 each have corresponding bias circuits 114, 116 for controlling the Gain of their respective amplifier stages. A voltage supply $V_{DD}$ 118 provides power as needed to specific circuitry in the IC 102, and may be variable as a function of a control parameter to regulate the behavior of the PA 100. The voltage supply $V_{DD}$ may be provided from off-chip or may be generated on-chip from an external power source; an off-chip configuration is shown by way of example.

In operation in a TDD based radio system, such as WiFi system, a PA 100 will be powered ON in response to a supplied control signal (not shown) and amplify a transmission signal for a period of time, and then be powered OFF by the supplied control signal. FIG. 2 is a graph of an example ideal RFout pulse 200 from a TDD PA 100, and of an example realistic RFout pulse 202 from a TDD PA showing output power (Gain) as a function of time. As shown, the illustrated ideal pulse 200 ideally has a square wave-form over a 4 mS operational interval (such an interval corresponds to a "long packet" in a WiFi system). However, in actual pulsed PA circuits, self-heating of the PA generally causes Gain to "droop"—that is, as the PA circuit warms up due to current flow through the first and second amplifier stages 106, 110, Gain decreases over time. Self-heating of the PA 100 causes its Gain to droop by more than about 0.2 dB in 4 mS, as shown by the realistic pulse 202.

Some advanced RF systems have a specification that requires that Gain not droop more than a specified amount. For example, systems conforming to the WiFi 802.11ac standard may not exhibit more than 0.17 dB of PA Gain droop, and systems conforming to the WiFi 802.11ax standard may not exhibit more than 0.10 dB of PA Gain droop. The inability to maintain a flat enough Gain over time for pulses means that corresponding error vector magnitude (EVM) specifications cannot be met as well. Some attempts have been made to continuously monitor the ambient temperature of an IC and adjust the Gain of a PA amplifier stage accordingly. However, by not responding only to self-heating during pulsed operation, such an approach causes too much bias current variation as ambient temperature varies, resulting in poor linearity performance due to under or over-biasing the PA across a full ambient temperature range.

Accordingly, there is a need for a circuit and method for controlling a power amplifier circuit to maintain approximately constant Gain versus time during pulsed operation sufficient to substantially offset self-heating of the power amplifier. The present invention meets this need.

SUMMARY OF THE INVENTION

The invention encompasses temperature compensation circuits that adjust one or more circuit parameters of a power amplifier (PA) to maintain approximately constant Gain versus time during operation (including pulsed operation) sufficient to substantially offset self-heating of the PA.

Some embodiments of the invention compensate for PA Gain "droop" due to self-heating using an analog and/or digital Sample and Hold (S&H) circuit. After a pulse commences within the PA, at least one S&H circuit samples and holds a temperature sensing element output signal corresponding to the temperature of the PA at a specified moment. Thereafter, each S&H circuit generates a continuous measurement that corresponds to the temperature of the PA during the remainder of the pulse. A "droop" Gain Control signal is then generated that is a function of the difference between the initial temperature and the subsequently measured operating temperature of the PA as the PA self-heats for the duration of the pulse.

One or more correction signals—in particular, Gain Control signals—may be applied to one or more adjustable or tunable circuits within a PA to offset the Gain droop of the PA. Examples of such circuits include the bias circuit for one or more PA amplifier stages, one or more impedance matching networks (e.g., input, interstage, and/or output IMNs), one or more auxiliary amplifier stages (e.g., variable Gain amplifiers), one or more adjustable attenuation circuits on the input and/or output of the PA, and/or voltage or current supply circuits within or to the PA. Embodiments of the invention can maintain the effective temperatures of the operational components of a PA circuit within 2.5° C. from −40° C. to +85° C., and maintain RF Gain within about ±0.05 dB during at least a 4 mS operational pulse.

Other aspects of the invention include analog and digital examples of an S&H circuit that may be used in embodiments of the invention, continuous temperature compensation used in combination with compensation for PA self-heating compensation during pulsed operation, use of direct temperature sensing, use of indirect temperature measurement for generation of a Gain control signal to offset PA self-heating during pulsed operation, and placement of temperature sensing circuits on an integrated circuit.

Another aspect of the invention includes bias compensation circuits that directly regulate a bias signal to an amplifier stage as a function of localized heating of one or more of amplifier stages. Such bias compensation circuits include physical placement of at least one bias compensation circuit element in closer proximity to at least one amplifier stage than other bias compensation circuit elements. One bias compensation circuit embodiment includes a temperature-sensitive current mirror circuit for regulating the bias signal. Another bias compensation circuit embodiment includes a temperature-sensitive element having a positive temperature coefficient (PTC) for regulating the bias signal.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 3 is a block diagram of a generalized circuit for generating a Gain Control (GC) signal suitable for adjusting one or more circuit parameters of a PA as a function of direct temperature measurement to maintain approximately constant Gain versus time during pulsed operation sufficient to substantially offset self-heating of the PA.

FIG. 4A is a graph of PA Bias Current and Gain versus time for an amplification pulse of a conventional PA.

FIG. 4B is a graph of PA Bias Current and Gain versus time for an amplification pulse of a PA in which the Bias Current is augmented and varied by a GC signal generated by the GC signal circuit of FIG. 3.

FIG. 12E is a process flow diagram of a method for temperature compensating an integrated circuit including (1) a power amplifier having a corresponding Gain that droops due to self-heating of the power amplifier during pulsed operation and (2) a temperature compensation circuit.

FIG. 19 is a process flow diagram of a first method for adjusting radio frequency amplifier bias as a function of temperature.

Like reference numbers and designations in the various drawings indicate like elements.

DETAILED DESCRIPTION OF THE INVENTION

Overview

Figure 1:
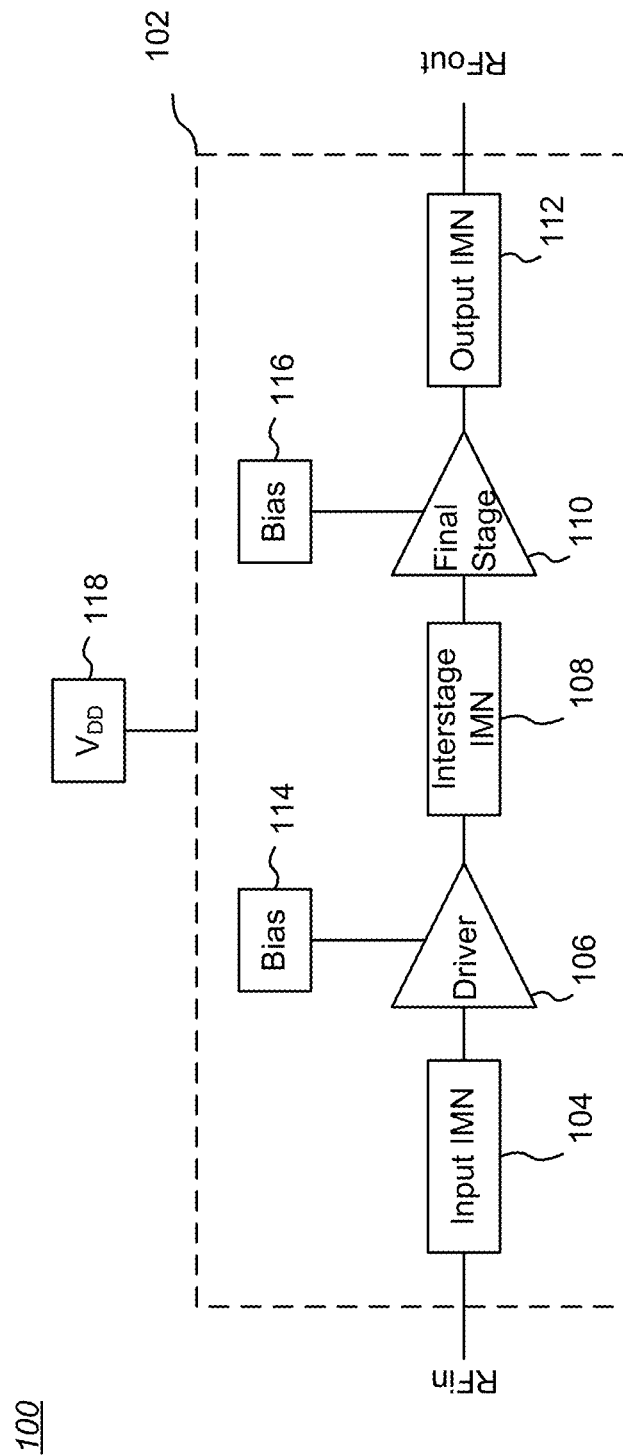
FIG. 1 is a block diagram of a typical prior art radio transmitter two-stage power amplifier.
Figure 2:
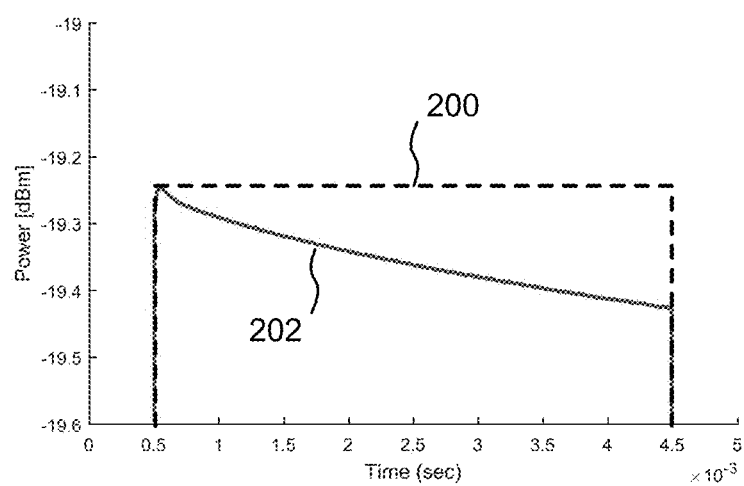
FIG. 2 is a graph of an example ideal RFout pulse from a TDD PA, and of an example realistic RFout pulse from a TDD PA, showing output power (Gain) as a function of time.

The invention encompasses temperature compensation circuits that adjust one or more circuit parameters of a power amplifier (PA) to maintain approximately constant Gain versus time during operation (including pulsed operation) sufficient to substantially offset self-heating of the PA.

Some embodiments of the invention compensate for PA Gain "droop" due to self-heating using an analog and/or digital Sample and Hold (S&H) circuit. After a pulse commences within the PA, at least one S&H circuit samples and holds a temperature sensing element output signal corresponding to the temperature of the PA at a specified moment. Thereafter, each S&H circuit generates a continuous measurement that corresponds to the temperature of the PA during the remainder of the pulse. A "droop" Gain Control signal is then generated that is a function of the difference between the initial temperature and the subsequently measured operating temperature of the PA as the PA self-heats for the duration of the pulse.

One or more correction signals—in particular, Gain Control signals—may be applied to one or more adjustable or tunable circuits within a PA to offset the Gain droop of the PA. Examples of such circuits include the bias circuit for one or more PA amplifier stages, one or more impedance matching networks (e.g., input, interstage, and/or output IMNs), one or more auxiliary amplifier stages (e.g., variable Gain amplifiers), one or more adjustable attenuation circuits on the input and/or output of the PA, and/or voltage or current supply circuits within or to the PA. Embodiments of the invention can maintain the effective temperatures of the operational components of a PA circuit within 2.5° C. from −40° C. to +85° C., and maintain RF Gain within about ±0.05 dB during at least a 4 mS operational pulse.

Other aspects of the invention include analog and digital examples of an S&H circuit that may be used in embodiments of the invention, continuous temperature compensation used in combination with compensation for PA self-heating compensation during pulsed operation, use of direct temperature sensing, use of indirect temperature measurement for generation of a Gain control signal to offset PA self-heating during pulsed operation, and placement of temperature sensing circuits on an integrated circuit.

Another aspect of the invention includes bias compensation circuits that directly regulate a bias signal to an amplifier stage as a function of localized heating of one or more of amplifier stages. Such bias compensation circuits include physical placement of at least one bias compensation circuit element in closer proximity to at least one amplifier stage than other bias compensation circuit elements. One bias compensation circuit embodiment includes a temperature-sensitive current mirror circuit for regulating the bias signal. Another bias compensation circuit embodiment includes a temperature-sensitive element having a positive temperature coefficient (PTC) for regulating the bias signal.

While aspects of the invention are described in the context of power amplifiers operated in a pulsed mode, the temperature compensation circuits encompassed by the invention are also generally applicable to target circuits having performance parameters affected by temperature and for which a flat response is desired, so long as such circuits have some adjustable parameter which allows compensating adjustment of the response.

Direct Temperature Measurement Gain Control Signal Generation

FIG. 3 is a block diagram of a generalized circuit 300 for generating a Gain Control (GC) signal suitable for adjusting one or more circuit parameters of a PA as a function of direct temperature measurement to maintain approximately constant Gain versus time during pulsed operation sufficient to substantially offset self-heating of the PA. The GC signal circuit 300 may be fabricated as part of an IC that includes a PA, but in some applications one or more components of the GC signal circuit 300 may be external to such an IC. In many applications, it may be desirable to have one GC signal circuit 300 per PA amplifier stage.

One or more temperature sensors 302 capable of measuring the temperature of a PA or of a circuit that closely follows the temperature of a PA (e.g., a small-scale replica of a PA) are coupled to a sample-and-hold (S&H) circuit 304, optionally through an amplifier or buffer 306. Each temperature sensor 302 may include, for example, a PN junction diode, a diode-connected field effect transistor (FET), a resistor, a proportional-to-absolute temperature (PTAT) circuit, a digital temperature sensor, etc. In many applications, it is desirable for the temperature sensors 302 to have a fast response time to changes in temperature (i.e., high thermal diffusivity).

An important characteristic of the S&H circuit 304 is that it be able to capture (sample and hold) a signal from the temperature sensors 302 representing the temperature T of an associated PA at an initial time point $t=t_0$ and provide that held (fixed) signal, $T(t=t_0)$, as a first output. Thereafter, the S&H circuit 304 generates a continuous measurement that corresponds to the temperature T of the PA during the remainder of the pulse (i.e., for times $t>t_0$) and provides that variable signal, $T(t>t_0)$, as a second output. The initial time point to is controlled by a Hold control signal normally set to be applied to the S&H circuit 304 shortly after (e.g., 5-10 μS) the commencement of an operational pulse within the PA. Delayed capture of $T(t=t_0)$ allows the PA to reach its peak Gain and/or a desired initial operating condition after pulse commencement.

The two outputs of the S&H circuit 304, $T(t=t_0)$ and $T(t>t_0)$, are coupled to respective inputs of a differential amplifier 308. The differential amplifier 308 may be, for example, a differential transconductance amplifier that turns a voltage difference between two input terminals into a current at an output terminal. However, other circuits may be used that can generate an output that is a function of the difference between two provided inputs.

The differential amplifier 308 generates an output signal ΔT that represents the difference between the initial temperature $T(t=t_0)$ and the subsequently measured PA operating temperature $T(t>t_0)$ as the PA self-heats for the duration of the pulse. The output signal ΔT from the differential amplifier 308 may be applied to a correction circuit, such as an optional mapping circuit 310 that maps or associates ΔT signal values to control signal values (e.g., voltage or current levels) to output a Gain Control (GC) signal that is a function of the difference between the initial temperature and the subsequently measured PA operating temperature as the PA self-heats for the duration of the pulse.

In some applications, the ΔT output signal of the differential amplifier 308 may be essentially used directly as the GC signal (e.g., where the "mapping" of the ΔT output signal to GC signal is linear and properly proportionate). In other applications, the "mapping" of the ΔT output signal to GC signal may apply an offset linear function, an inverse function, or a non-linear function (e.g., a logarithmic function). In any case, the mapping function may be programmable. Programming such a mapping function for an IC embodying GC signal circuit 300 may be performed once, such as during fabrication or in the field (e.g., by burning or "blowing" fusible links). Alternatively, such programming may vary as a function of programmed input to the IC from an external source, and/or as a function of IC state or status. In some embodiments, the ΔT output signal of the differential amplifier 308 may be digitized (e.g., through an analog-to-digital converter, or ADC) and applied to a look-up table (LUT) programmed with a desired mapping function in order to generate a GC signal; the GC signal output from the LUT may be used directly for digitally adjustable components, or converted back into a voltage or current signal for application to analog circuitry.

Because the GC signal circuit 300 measures an initial temperature $T(t=t_0)$ of a PA and compares that temperature to subsequently measured values of PA operating temperature $T(t>t_0)$, the GC signal is a function of PA self-heating during pulsed operation, regardless of other contributors to temperature inside and/or outside of an IC.

Application of GC Signal

The output GC signal generated by the GC signal circuit 300 may be used to offset the Gain droop of a PA as the PA self-heats for the duration of a pulse. A variety of circuit parameters can be adjusted to achieve such an offset. For example, FIG. 4A is a graph of PA Bias Current 402a and Gain 404a versus time for an amplification pulse of a conventional PA. While the PA Bias Current 402a rises quickly and is then essentially flat for the pulse duration, the corresponding PA Gain 404a exhibits droop over time due to self-heating of the PA.

In contrast, FIG. 4B is a graph of PA Bias Current 402b and Gain 404b versus time for an amplification pulse of a PA in which the Bias Current 402b is augmented and varied by a GC signal generated by the GC signal circuit 300 of FIG. 3. For example, the GC signal may be a current summed with the normal Bias Current applied to a PA. In the illustrated example, PA Bias Current 402b rises quickly and is then adjusted even higher by the GC signal as a function of PA self-heating temperature rise during the pulse duration. The increased Bias Current 402b to the PA increases the Gain of the PA. Accordingly, the droop in Gain of the PA that would otherwise occur due to self-heating is substantially offset by a nearly mirror-image of the drooping Gain curve 404a of FIG. 4A, leading to an essentially flat PA Gain 404b for the duration of the pulse.

Figure 5:
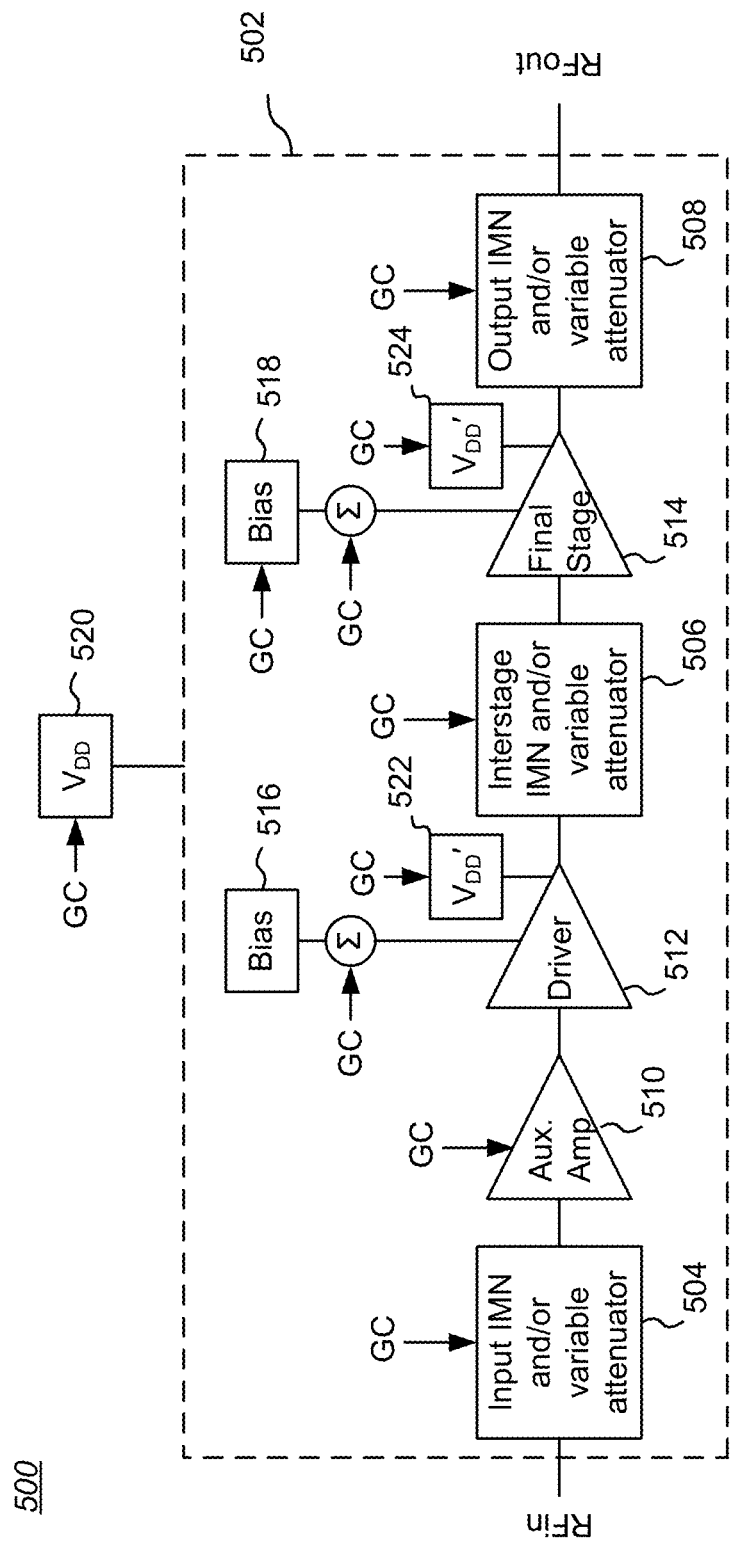
FIG. 5 is a block diagram of a PA on an integrated circuit having multiple components whose parameters may be adjusted to offset self-heating Gain droop of the PA under control of the GC signal from the circuit of FIG. 3.

More generally, the output GC signal generated by the GC signal circuit 300 may be used to offset the self-heating Gain droop of a PA by varying any PA circuit parameter or set of parameters that controls the effective Gain of the PA output at RFout so as to essentially flatten the effective Gain. Such circuit parameters include output power, voltage, current, and/or RF signal amplitude. For example, FIG. 5 is a block diagram of a PA 500 on an integrated circuit 502 having multiple components whose parameters may be adjusted to offset self-heating Gain droop of the PA under control of the GC signal from the circuit of FIG. 3.

In the illustrated example, an input IMN and/or variable attenuator circuit 504 may be controlled by a coupled GC signal so as to vary the matching characteristics of the circuit and/or the RF signal path attenuation level in order to offset the PA Gain droop. For example, a digital step attenuator (DSA) or variable analog attenuator may be configured to always provide a nominal level of signal amplitude attenuation, which may be adjusted downward by the GC signal (converted if necessary to digital form through an ADC) to reduce RF signal attenuation from RFin to RFout, thus compensating for PA Gain droop by increasing the amplitude of the RF signal. A similar approach may be used for an intermediate IMN and/or variable attenuator circuit 506, and/or for an output IMN and/or variable attenuator circuit 508.

As another example, an auxiliary amplifier 510, such as a variable Gain amplifier (VGA), may be placed in the RF signal path between RFin and RFout to provide additional signal amplification (Gain) in response to the GC signal, thus compensating for PA Gain droop.

Looking at the first amplifier (driver) stage 512 and the second amplifier (final) stage 514 of the example PA 500, a GC signal may be combined with the output of their respective bias circuits 516, 518 to boost the bias level of one or both amplifier stages (that is, in some applications, only one amplifier stage 512, 514 need be compensated in order to offset the self-heating PA droop of all amplifier stages). For example, an analog current representing the GC signal may be summed with the normal bias current applied to one or both amplifier stages. Alternatively, a GC signal may be applied to the respective bias circuits 516, 518 to internally adjust the bias level supplied to one or both amplifier stages. Further details regarding biasing of a PA are disclosed in U.S. patent application Ser. No. 14/272,415, filed May 7, 2014, entitled "Mismatch Detection Using Replica Circuit", and in U.S. patent application Ser. No. 15/268,229, filed Sep. 16, 2016, entitled "Cascode Amplifier Bias Circuits", both of which are assigned to the assignee of the present invention, and the contents of which are hereby incorporated by reference.

As another example, the voltage supply $V_{DD}$ 520 to the IC 502 may be varied (e.g., boosted) as a function of the GC signal to compensate for self-heating PA droop. Alternatively, the voltage (and/or current) supplied only to specific components of the PA may be varied as a function of the GC signal to compensate for self-heating PA droop. For example, drain voltage sources $V_{DD}'$ 522, 524 may be derived from $V_{DD}$ 520 and applied to the "top" of a corresponding stack of N FETs comprising each amplifier stage 512, 514 (N is typically between 3 and 5). The drain voltage sources $V_{DD}'$ 522, 524 may be varied by the GC signal to adjust the effective Gain of the stage. As one example, the drain voltages sources $V_{DD}'$ 522, 524 may be derived from $V_{DD}$ 520 by placing a low drop-out (LDO) voltage regulator between $V_{DD}$ and the drain of a stack of FETs comprising a PA stage. Increasing the output voltage of the LDO would increase the Gain of the FET stack. Accordingly, to compensate for Gain droop, the LDO output voltage could initially be set to a relatively low value, and then increased to maintain an essentially constant Gain.

Another alternative is to adjust the gate bias voltages to one or more of the N FETs in an amplifier stage stack to change the drain voltage on the "bottom" FET in the stack, thereby adjusting its Gain. This approach does not require any additional power supply, but merely redistributes the available $V_{DD}$ across the FETs in the stack to achieve a desired Gain adjustment.

As noted above, in many applications, it may be desirable to have one GC signal circuit 300 per PA amplifier stage. However, as should be clear from the above disclosure, the GC signal from one GC signal circuit 300 may be used to adjust the effective Gain of the PA as a whole during an operational pulse by adjusting only one or a subset of the PA components. Accordingly, it is not necessary that the GC signal from a GC signal circuit 300 associated with a PA amplifier stage be used to adjust only parameters of the associated stage to offset self-heating PA droop. For example, if separate GC signal circuits are associated with a PA driver stage and a PA final stage, and the resulting GC signals are used to control the bias applied to at least one stage, then at least the configurations shown in TABLE 1 are possible.

TABLE 1

| Stage for which ΔT is measured to generate GC signal | Stage for which bias is adjusted in response to generated GC signal |
| --- | --- |
| Driver | Driver |
| Final | Final |
| Final | Driver |
| Driver | Final |
| Final | Driver & Final |
| Driver | Driver & Final |

Example Analog Sample and Hold Circuit

Figure 6A:
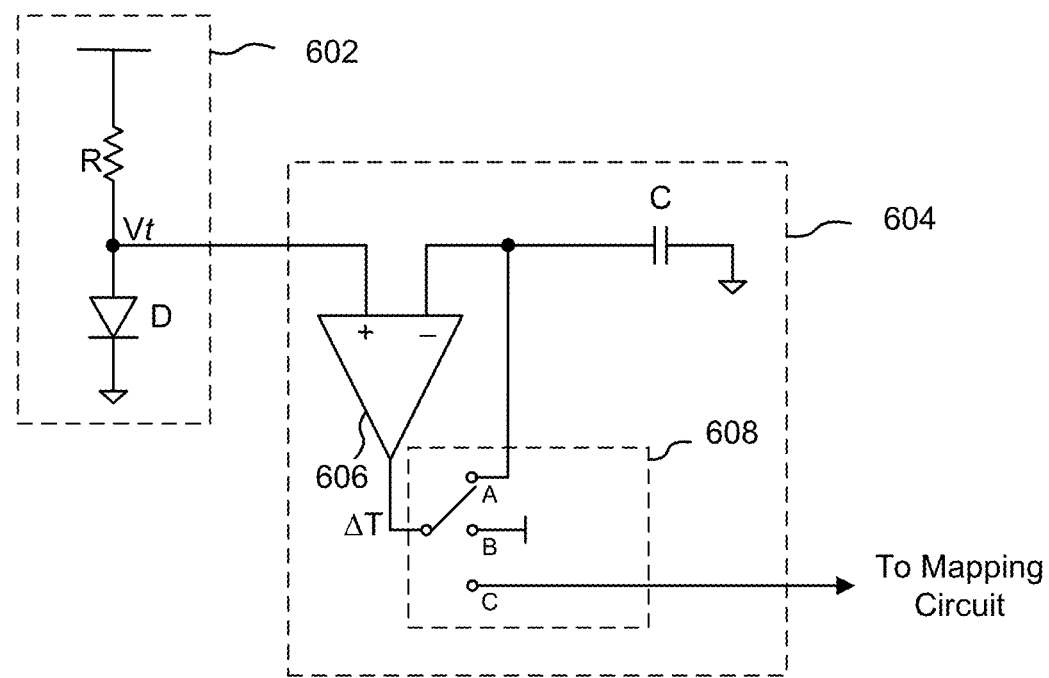
FIG. 6A is a schematic diagram of one embodiment of an analog temperature sensor and S&H circuit that may be used in the circuit of FIG. 3.

FIG. 6A is a schematic diagram of one embodiment of an analog temperature sensor 602 and S&H circuit 604 that may be used in the circuit of FIG. 3. The temperature sensor 602 includes a series-coupled resistor R and diode D coupled between a voltage supply and circuit ground. If the diode D is fabricated in reasonably close proximity to an amplifier stage of a PA, the node between the resistor R and diode D will have a voltage Vt that varies as a function of the temperature of the amplifier stage (see further disclosure below regarding placement of temperature sensor circuits). As should be clear, a different temperature sensing circuit could be used in place of the diode-based temperature sensor 602; examples are given above.

The voltage Vt is coupled to a first input of a differential amplifier 606 which may be, for example, a differential transconductance amplifier (however, as noted above, other circuits may be used that can generate an output that is a function of the difference between two provided inputs). The output of the differential amplifier 606 is coupled to a 3-terminal switch 608 that may be implemented with field effect transistors (FETs). Terminal A of the switch 608 is coupled to a charge storage capacitor C and to a second input of the differential amplifier 606. Terminal B is an open circuit, and terminal C is coupled to a mapping circuit as in FIG. 3, or is directly used as a GC signal.

Figure 6B:
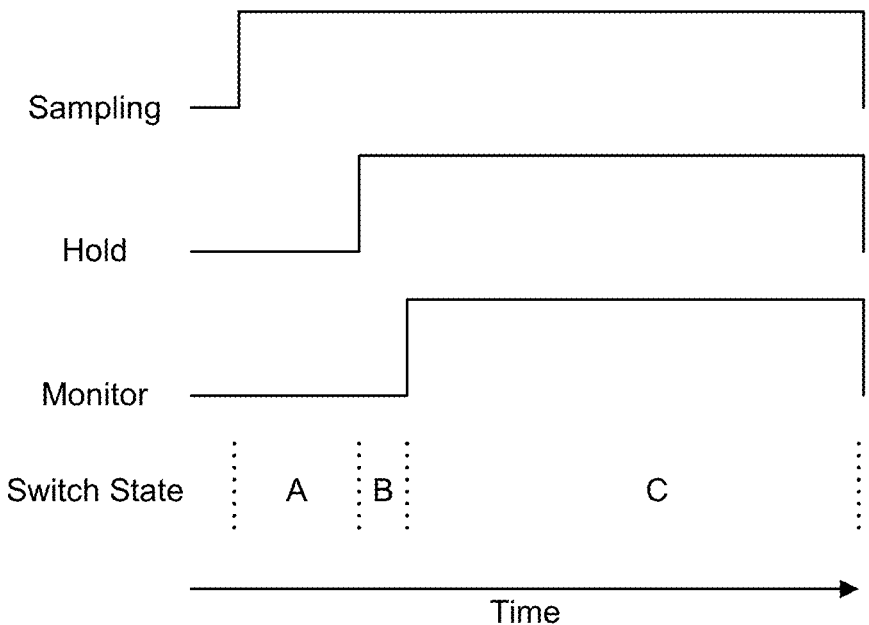
FIG. 6B is a timing diagram showing one example of the control signals for the A, B, and C terminals of the switch of FIG. 6A.

The state of the switch 608 is set by control signals essentially derived from the supplied control signal, PA_en, that powers the PA ON and OFF, defining a pulse. FIG. 6B is a timing diagram showing one example of the control signals for the A, B, and C terminals of the switch 608 of FIG. 6A.

When the PA is powered ON (enabled) by its control signal PA_en (not shown), the temperature sensor 602 and S&H circuit 604 are also powered ON; alternatively, the temperature sensor 602 and S&H circuit 604 may always be ON, but be initialized at the rising edge of PA_EN signal. In either case, concurrently with the assertion of an "enabled" state by the control signal PA_en (or after a desired delay), a Sampling signal is generated and applied to the switch 608 to couple the output of the differential amplifier 606 to terminal A as an initial state. As a consequence, capacitor C will be charged up until both inputs to the differential amplifier 606 are equal to Vt, the voltage representing the momentary temperature of an associated amplifier stage of a PA. More precisely, for the case where the differential amplifier 606 is a transconductance amplifier, the voltage on the positive input will be Vt, but the voltage on the negative input (and on capacitor C) will be the combination of Vt and the inverse of the cumulative offsets (imbalances) in the differential amplifier 606 required to set its output current to zero (once the voltage on capacitor C settles to a static value, no current can flow). Accordingly, the S&H circuit 604 in effect calibrates out all of its offsets during the Sampling phase, and capacitor C is in essence constantly tracking the temperature of the associated PA.

After a short delay (e.g., about 5-10 μS), a Hold signal is generated and applied to the switch 608 to couple the output of the differential amplifier 606 to terminal B and thus uncouple the capacitor C from any further input from the differential amplifier 606; the transition to terminal B provides a non-overlapping switching sequence to reduce sampling errors. The Hold signal may be a delayed version of the Sampling signal (the circuits for delaying timing signals are conventional and thus not shown). At the moment of assertion of the Hold signal, to, the capacitor C has a charge that represents the temperature $T(t=t_0)$ of the associated PA amplifier stage (as well as any associated S&H circuit 604 offsets, so as to effectively dynamically calibrate out such offsets as noted above). Thus, coupling the output of the differential amplifier 606 to terminal B for a brief (e.g., 0.1-1 μS) transition period allows the circuitry to settle to a new state—thus avoiding transients in the GC signal circuitry—while preserving the sampled charge on capacitor C. For example, the compensation circuit that includes the S&H circuit 604 may generate a Gain step when it transitions to the Hold phase, so this should occur before an RF receiver begins to lock in its Gain equalization.

Thereafter, a Monitor signal is generated and applied to the switch 608 to couple the output of the differential amplifier 606 to terminal C. The Monitor signal may be a delayed version of the Sampling signal or of the Hold signal. When the S&H circuit 604 is in this configuration, one input of the differential amplifier 606 is the stored charge (voltage) on capacitor C, representing $T(t=t_0)$, while the other input of the differential amplifier 606 is Vt, representing $T(t>t_0)$—that is, the continuously measured temperature of the PA during a pulse. The output of the differential amplifier 606 is ΔT, which represents the difference between the initial temperature $T(t=t_0)$ and the subsequently measured PA operating temperature $T(t>t_0)$ as the PA self-heats for the duration of a pulse.

As should be clear, other analog sample and hold circuits may be used to determine $\Delta T = T(t>t_0) - T(t=t_0)$ during the occurrence of PA pulsed operation.

Example Digital Sample and Hold Circuit

Figure 7:
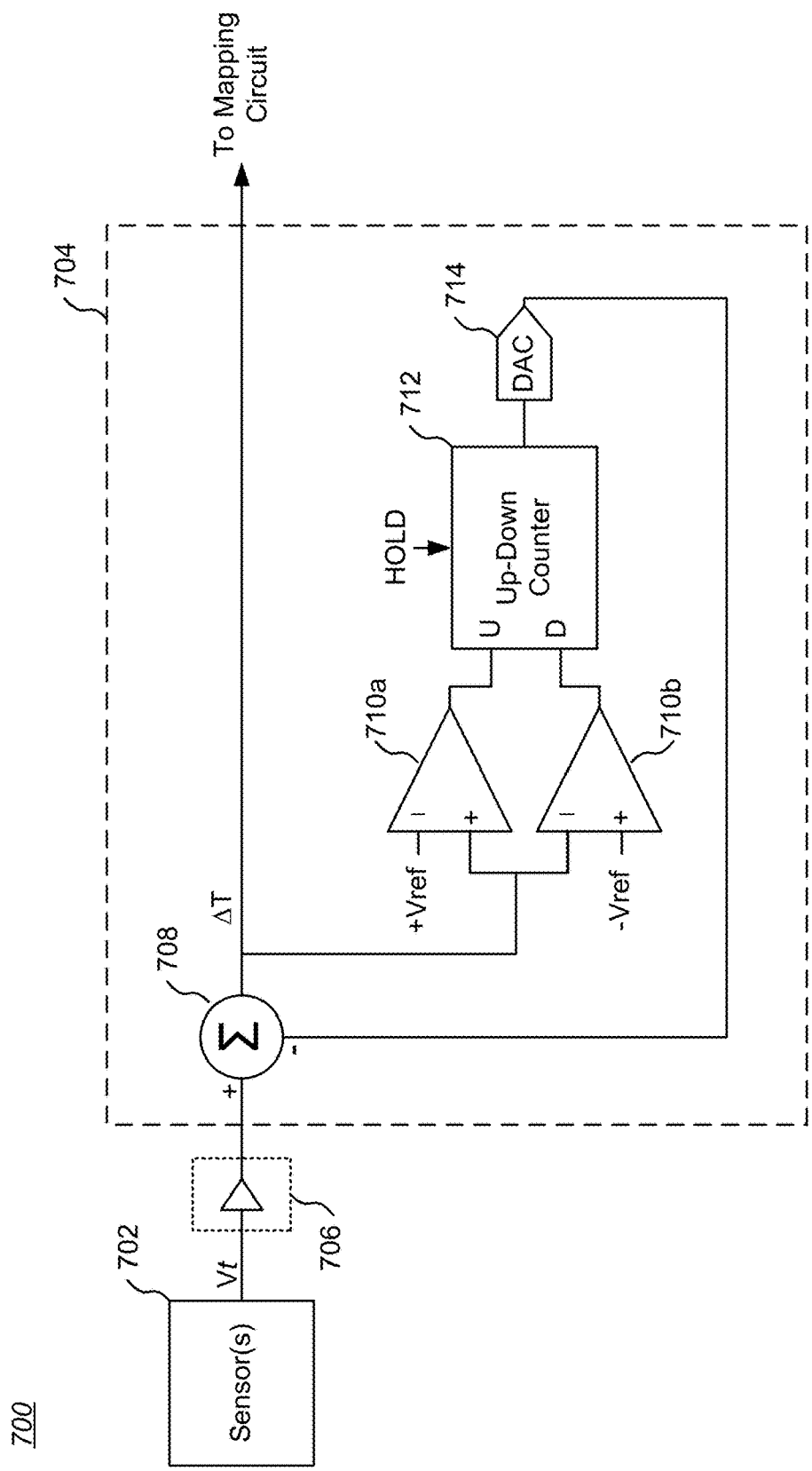
FIG. 7 is a block diagram of one embodiment of a partially digital S&H circuit.

FIG. 7 is a block diagram of one embodiment of a partially digital S&H circuit 700. The output Vt of one or more temperature sensors 702 is coupled to the input of a counter-DAC-based circuit 704, optionally through an amplifier or buffer 706. More specifically, the temperature sensors 702 are coupled to the plus-input of a summing circuit 708 in this example. The output of the summing circuit 708 is coupled to an optional mapping circuit or may be used directly as a GC signal.

The output of the summing circuit 708 is also coupled to opposite polarity inputs of two comparators 710a, 710b. The other inputs of the comparators 710a, 710b are coupled to a associated reference voltages +Vref and −Vref. In the illustrated example, a positive reference voltage +Vref (e.g., +0.5LSB) is applied to the negative input of comparator 710a, and a negative reference voltage −Vref (e.g., −0.5LSB) is applied to the positive input of 710b. The outputs of the comparators 710a, 710b are coupled to respective Up and Down inputs of an Up-Down counter 712. The count output of the Up-Down counter 712 is coupled to a DAC 714, the analog output of which is coupled to the minus-input of the summing circuit 708. A HOLD signal controls enablement of the Up-Down counter 712, and may be a delayed version of the PA_en control signal for an associated PA.

In operation, the differential voltage sum from the summing circuit 708 (i.e., plus-voltage less minus-voltage) is applied to the comparators 710a, 710b. While the Up-Down counter 712 is enabled (e.g., the HOLD signal=0), if the sum is greater than +Vref, the Up-Down counter 712 counts UP; conversely, if the sum is less than −Vref, the Up-Down counter 712 counts DOWN. The digital output of the Up-Down counter 712 is converted back to an analog signal by the DAC 714.

When the output of the DAC 714 equals Vt (within a margin of error of ±0.5 LSB) at a moment in time, the output of the Up-Down counter 712 does not change state. If Vt decreases (indicating an increase in temperature of the associated PA when using a sensor having a negative temperature coefficient, such as the diode-based sensor as in FIG. 6A), then the Up-Down counter 712 will count DOWN until the output of the DAC 714 again equals the Vt (within the margin of error). Conversely, if Vt increases (indicating a decrease in temperature of the associated PA when using a sensor having a negative temperature coefficient), then the Up-Down counter 712 will count UP until the output of the DAC 714 again equals the Vt (again, within the margin of error). Accordingly, the output of the DAC 714 represents the continuously tracked temperature of the associated PA while the Up-Down counter 712 is enabled. As should be clear, other temperature sensors may have a positive temperature coefficient (i.e., Vt would increase with increasing temperature and decrease with decreasing temperature); the mapping circuit may be used to account for a sign or function change in the S&H circuit 700.

When the HOLD signal is asserted (e.g., HOLD=1) at time $t_0$, thereby disabling counting in the Up-Down counter 712, the output of the Up-Down counter 712 cannot change. Accordingly, the last count output represents a held value for Vt, which represents $T(t=t_0)$. Since the minus-input to the summing circuit 708 is thereafter constant for the duration of a pulse, and the plus-input to the summing circuit 708 tracks the value of Vt, which represents $T(t>t_0)$, the output of the summing circuit 708 is ΔT. As noted above, ΔT represents the difference between the initial temperature $T(t=t_0)$ and the subsequently measured PA operating temperature $T(t>t_0)$ as the PA self-heats for the duration of a pulse. The ΔT value may be used directly as a GC signal or mapped to generate a GC signal as described above.

As should be clear, other digital or partly digital sample and hold circuits may be used to determine $\Delta T=T(t>t_0)-T(t=t_0)$ during the occurrence of PA pulsed operation.

Temperature Difference Measured at Proximate & Distant Locations

In some applications, two or more continuous temperature sensing circuits can be used to isolate measurements of PA self-heating during pulsed operation without using a sample and hold configuration. A first continuous temperature sensing circuit may be located in close proximity to a PA, while a second continuous temperature sensing circuit may be located at a farther distance from the heat-generating components on an IC, particularly the PA amplifier stages, so as to measure general IC temperature while minimizing the influence of heat generated by other circuits on the IC. Examples of such placements are discussed below with respect to FIG. 11.

Instead of holding an initial temperature reading in an S&H circuit, the measurements from the distant continuous temperature sensing circuit would be subtracted from the measurements from the proximate continuous temperature sensing circuit during pulsed operation of the PA associated with the proximate continuous temperature sensing circuit. The resulting difference may be applied to a mapping circuit to generate a Continuous GC signal that reflects essentially only PA self-heating during pulsed operation.

In essence, rather than defining a ΔT as being the difference between a temperature at an initial time and a temperature at a subsequent time, ΔT can instead be defined as the difference between a proximate temperature T(p) indicative of self-heating during pulsed operation of a PA, and a distant temperature T(d) reflecting general IC temperature; that is, $\Delta T=T(p)-T(d)$. As should be clear, a variety of circuits may be used to determine ΔT in this fashion during the occurrence of PA pulsed operation. The resulting difference, ΔT, may then be mapped to a GC signal and the GC signal applied to offset the self-heating of the PA, as described above.

Figure 8:
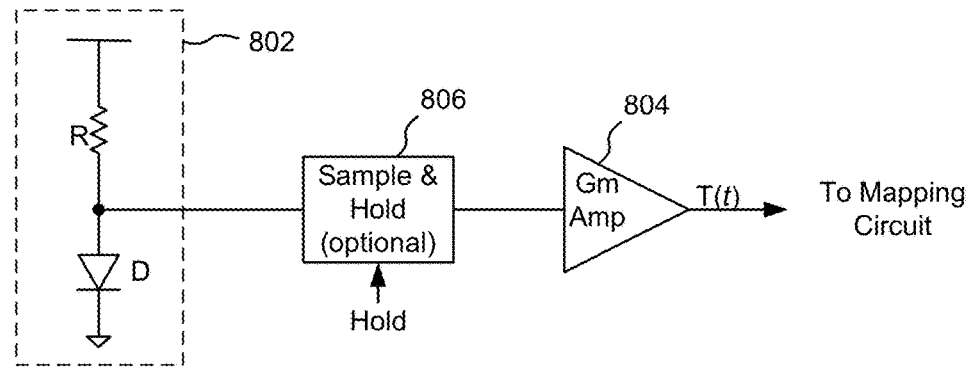
FIG. 8 is a schematic diagram of one embodiment of a continuous temperature compensation circuit.

Suitable continuous temperature sensing circuits may be readily implemented on an IC. For example, FIG. 8 is a schematic diagram of one embodiment of a continuous temperature compensation circuit 800. A temperature sensor 802 includes a series-coupled resistor R and diode D coupled between a voltage supply and circuit ground. The node between the resistor R and diode D will have a voltage Vt that varies as a function of the surrounding temperature. The voltage Vt may be amplified by a transconductance amplifier 804 that turns the voltage applied to its input terminal into a current at its output terminal. The output of the amplifier 804 represents a continuous measurement of temperature over time, T(t), at the location of the temperature sensor 802. As should be clear, other circuits may be used to determine T(t).

In a variation, the continuous temperature sensing circuit 800 used for distant temperature measurements may include an optional S&H circuit 806 so that the measured ambient temperature at the beginning of pulse may be sampled and held near the commencement of pulsed operation, thus "locking" the ambient temperature measurement to an invariant value for the duration of the pulse. The S&H circuit 806 would be controlled by a Hold signal generated by commencement of a pulse (possibly with some delay). Such a configuration would prevent PA self-heating during pulsed operation from influencing the distant temperature sensor.

Continuous Temperature Compensation

Any of the circuits for generating a GC signal described above (or their equivalents) can be used in conjunction with continuous temperature compensation of bias current to one or more stages of a PA. As is known, it is often useful to adjust the Gain of a PA to compensate for ambient temperature, such as the environment in which an IC is used (e.g., embedded within a cellular phone enclosure located in a desert).

For example, a continuous temperature sensing circuit 800 such as shown in FIG. 8 may be located at an appreciable distance from heat-generating components on an IC, particularly the PA amplifier stages, to minimize the influence of heat generated by other circuits on the IC. The output of such a continuous temperature sensing circuit 800 may be applied to a mapping circuit to generate an Ambient GC signal. Whereas the GC signal and Continuous GC signal described above are correlated with the self-heating of an associated PA, an Ambient GC signal is designed to be uncorrelated with such self-heating. In some embodiments, an Ambient GC signal may be summed with the normal Bias Current applied to a PA to compensate for variations in Gain due to changes in ambient temperature. In addition, a GC signal or Continuous GC signal may be summed with the normal Bias Current applied to a PA to compensate for variations in Gain due to PA self-heating during pulsed operation.

Indirect Temperature Measurement

In the embodiments described above, PA self-heating during pulsed operation was directly measured by one or more temperature sensor circuits. In alternative embodiments, PA self-heating during pulsed operation may be inferred (i.e., indirectly measured). For example, instead of measuring PA temperature rise due to self-heating and using the result to adjust Gain, measurement can be made of another circuit parameter of the PA or of a scaled replica of the PA that varies as a function of self-heating of the PA during pulsed operation. The resulting measurement can be used to adjust the effective Gain of the PA, such as by adding an off-setting current to the bias current for one or more amplifier stages of the PA.

Figure 9:
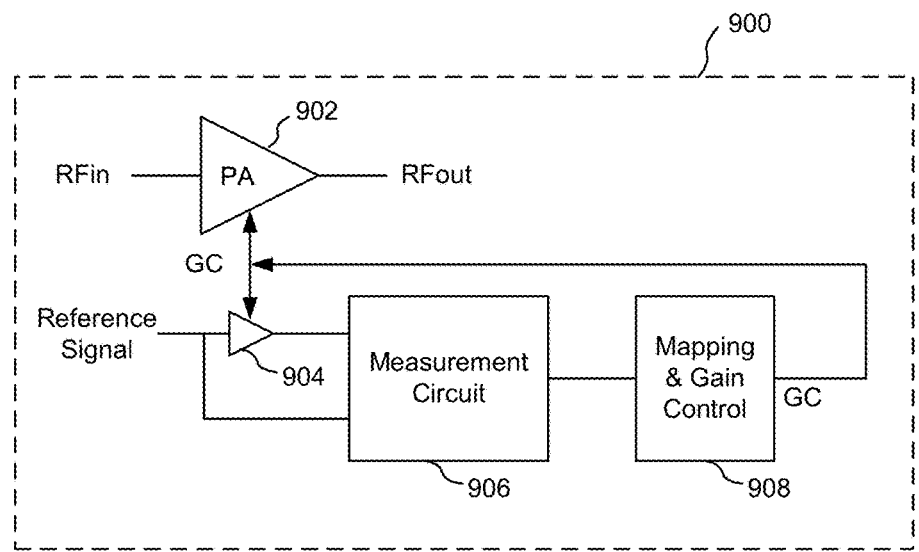
FIG. 9 is a first embodiment of an indirect temperature measurement Gain control signal generation circuit.

FIG. 9 is a first embodiment of an indirect temperature measurement Gain control signal generation circuit 900. The circuit 900 includes a conventional PA 902 having a Gain control adjustment (e.g., an adjustable bias circuit). Also included is a scaled replica amplifier 904 that, in known fashion, mimics the characteristics and performance behavior of the PA 902, but at a smaller scale (e.g., ⅛ size). The replica amplifier 904 would be fabricated in close proximity to the PA 902 so as to be affected by the self-heating of the PA 902 during pulsed operation. The nominal Gain for the replica amplifier 904 generally would be the same as the nominal Gain for the PA 902 to maximize correlation, but may be set to some other value, such as unity, to simply measurement.

In the illustrated example, a Reference Signal is applied to the input of the replica amplifier 904 and to a first input of a conventional measurement circuit 906, which may, for example, measure a desired parameter, such as Gain, power, voltage, current, etc. When using a replica amplifier 904, the Reference Signal typically would be an RF or AC signal (e.g., 0.5V±10 mV) simply intended to measure the small-signal response of the replica amplifier 904. The output of the replica amplifier 904 is coupled to a second input of the measurement circuit 906, which outputs a signal that represents the difference (e.g., in Gain, power, voltage, current, etc.) between the Reference Signal and the output of the replica amplifier 904.

Since the replica amplifier 904 mimics the behavior of the PA 902 and is located in close proximity to the PA 902, self-heating of the PA 902 during pulsed operation will cause a correlated temperature change in the replica amplifier 904. The change in temperature of the replica amplifier 904 during a pulse will cause the Gain of the replica amplifier 904 to droop. The measurement circuit 906 will output a signal proportional to the amount of droop in comparison to the Reference Signal, which thus represents an indirect, temperature-dependent measurement of the droop occurring in the PA 902 during the pulse. The measurement circuit 906 output may be coupled to a mapping and Gain control circuit 908 that provides a suitable GC signal back to the PA 902 and the replica amplifier 904 to boost their respective Gains in an amount sufficient to substantially offset the droop.

Since the measured parameter of the replica amplifier circuit 904 (e.g., change in Gain) is measured only during pulsed operation of the PA 902 and directly takes into account a characteristic that is a function of self-heating of the PA 902 during pulsed operation, no sample and hold circuitry is required. Alternatively, a S&H circuit (not shown) may be provided (e.g., within or after the measurement circuit 906) to capture a DC representation of the measured parameter of the replica amplifier circuit 904 at to and compare that held value to the instantaneous parameter value of the replica amplifier circuit 904 during pulsed-operation of the PA 902 to determine the amount of Gain droop of the amplifier circuit 904 (and hence of the PA 902, due to its self-heating during pulsed operation). The difference between the two measured values would be applied to the mapping and Gain control circuit 908 to generate a suitable GC signal back to the PA 902 and the replica amplifier 904 to boost their respective Gains in an amount sufficient to substantially offset the droop. The sample-and-hold configuration can be used continuously or as a sampled system. The benefit of using a sampled version is that the adjustment range is minimized (e.g., Δ10° C. instead of, for example, −40° C. to +85° C., which is a difference of 125° C.).

Further details regarding the use of replica circuits in conjunction with a PA are disclosed in U.S. patent application Ser. No. 14/272,415, filed May 7, 2014, entitled "Mismatch Detection Using Replica Circuit", incorporated by reference above.

Note that a similar approach may be utilized in which the power measurement circuit 906 is coupled to the input and output of the PA 902 itself (i.e., the replica amplifier 904 is not used).

Figure 10:
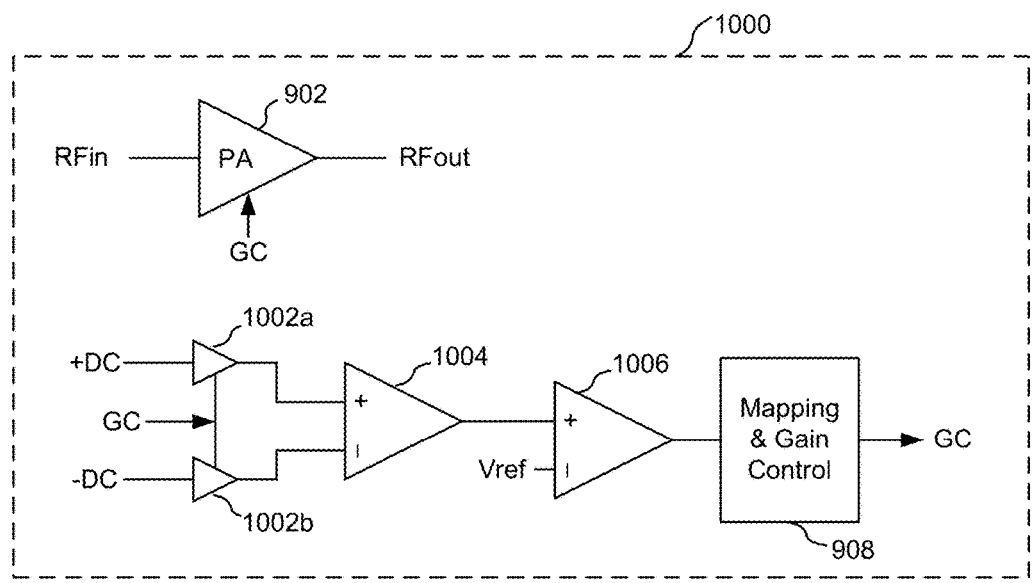
FIG. 10 is a second embodiment of an indirect temperature measurement Gain control signal generation circuit.

FIG. 10 is a second embodiment of an indirect temperature measurement Gain control signal generation circuit 1000. In this embodiment, instead of using an AC signal as reference signal as shown in FIG. 9, plus and minus DC voltages (e.g., 0.5V+10 mV=0.51V, and 0.5V−10 mV=0.49V) may be applied to a pair of scaled replica amplifiers 1002a, 1002b located in close proximity to a PA 902. The output of the replica amplifiers 1002a, 1002b may be applied to a first differential amplifier 1004.

The output of the first differential amplifier 1004 represents the Gains of the replica amplifiers 1002a, 1002b, which are assumed to be equal and also equal to the Gain of the PA 902. The output signal represents Gain because the DC input signals are assumed to be known and accurate. As an example, if +DC=1V+0.1V, and −DC=1V−0.1V, then the difference between the input voltages is equal to (1+0.1)−(1−0.1)=0.2V. If the Gain of the replica amplifiers 1002a, 1002b is 10, then the difference of the outputs of the replica amplifiers 1002a, 1002b is 10×0.2=2V. If the Gain of the replica amplifiers 1002a, 1002b increases to 11 due to self-heating of the PA 902, then this output difference would increase to 2.2V. This difference voltage (that represents Gain) is then compared to Vref in the second differential amplifier 1006 to determine if the difference value is too high or too low.

As with FIG. 9, the mapping and Gain control circuit 908 generates a suitable GC signal back to the PA 902 and the replica amplifiers 1002a, 1002b to boost their respective Gains in an amount sufficient to substantially offset the droop. The configuration of FIG. 10 thus allows determining the small-signal response of the replica amplifiers 1002a, 1002b by using DC measurements only. A variant of this architecture can also utilize a S&H circuit (not shown) in a similar fashion to the architecture described above for the S&H circuit variant of FIG. 9.

Placement of Temperature Sensing Circuits

Figure 11:
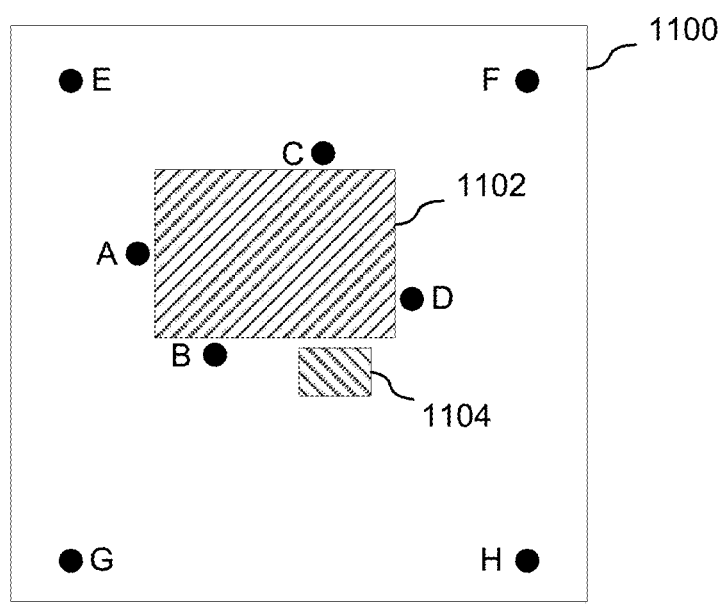
FIG. 11 is a top plan view of an example layout of an IC that includes a PA.

A particular power amplifier IC may include one or more temperature sensors for measuring PA self-heating during pulsed operation, and may include one or more temperature sensors for purposes of continuous temperature compensation. FIG. 11 is a top plan view of an example layout of an IC 1100 that includes a PA. This example includes a main region 1102 encompassing the circuitry for a PA, and a secondary region 1104 encompassing the circuitry for a replica amplifier. Shown are several possible locations A-D for PA pulsed-operation self-heating temperature sensors in close proximity to the main PA region 1102. Also shown are several possible locations E-H for continuous temperature compensation temperature sensors. Other locations and fewer or more locations may be used for either kind of temperature sensor. As described above, one or more replica amplifiers within the secondary region 1104 may also be used for indirect measurement of the self-heating of a PA in the adjacent main region 1102.

In many PA's having two amplifier stages, the final stage may generate as much as 80% of the PA heat, with the remainder of the PA heat generated by the driver stage. Accordingly, it is generally beneficial to place a PA pulsed-operation self-heating temperature sensor in close proximity to the final stage.

Close proximity of PA pulsed-operation self-heating temperature sensors to the power-consuming elements of a PA is important. While the concepts disclosed above work with sensor locations spaced away from a PA, distance increases the response time of measurement and hence introduces a lag in generation of a corrective GC signal.

In some applications, it may be useful to fabricate temperature sensors in multiple locations, such as locations A-H, and then determine which sensors in specific locations provide better performance (e.g., faster responding, better accuracy, stronger output signal, etc.). For example, in one test IC, 16 PA pulsed-operation self-heating temperature sensors were used to investigate optimal siting. Thereafter, the output from the selected sensors may be coupled to circuitry for compensating for PA self-heating during pulsed operation, or to suitable general continuous temperature compensation circuitry, as described above.

In other applications, it may be useful to include the output of several temperature sensors in determining a GC signal and/or a Continuous GC signal. For example, the output of the temperature sensors at locations A and B in FIG. 11 around the periphery of the main PA region 1102 could be determined (and scaled or weighted, if necessary) so as to provide an average of self-heating temperatures for the main PA region 1102.

When utilizing two or more continuous temperature sensing circuits 800 to determine $\Delta T = T(p) - T(d)$, as described above, a proximate location such as A-D may be paired with a distant location E-H.

Methods

Figure 12A:
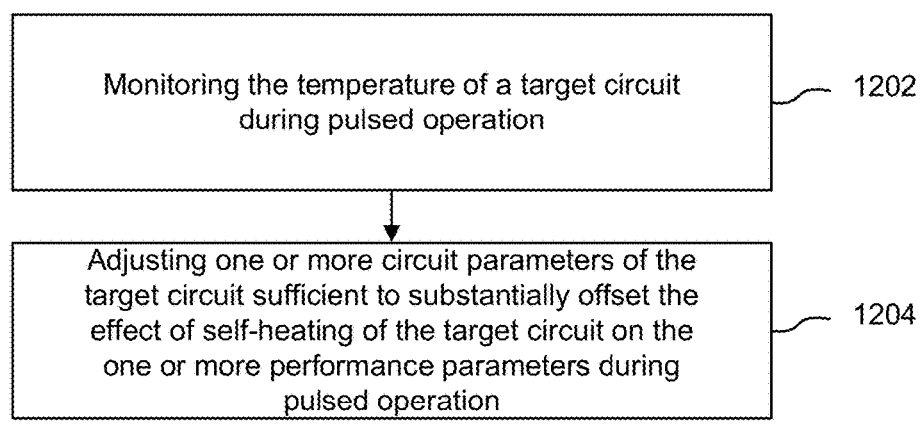
FIG. 12A is a process flow diagram of a first method for temperature compensating a target circuit having one or more performance parameters affected by self-heating during pulsed operation of the target circuit.

Another aspect of the invention includes methods for temperature compensating a target circuit having one or more performance parameters affected by self-heating during pulsed operation of the target circuit. For example, FIG. 12A is a process flow diagram 1200 of a first method for temperature compensating a target circuit having one or more performance parameters affected by self-heating during pulsed operation of the target circuit. The method steps include: monitoring the temperature of the target circuit during pulsed operation (STEP 1202); and adjusting one or more circuit parameters of the target circuit sufficient to substantially offset the effect of self-heating of the target circuit on the one or more performance parameters during pulsed operation (STEP 1204).

Figure 12B:
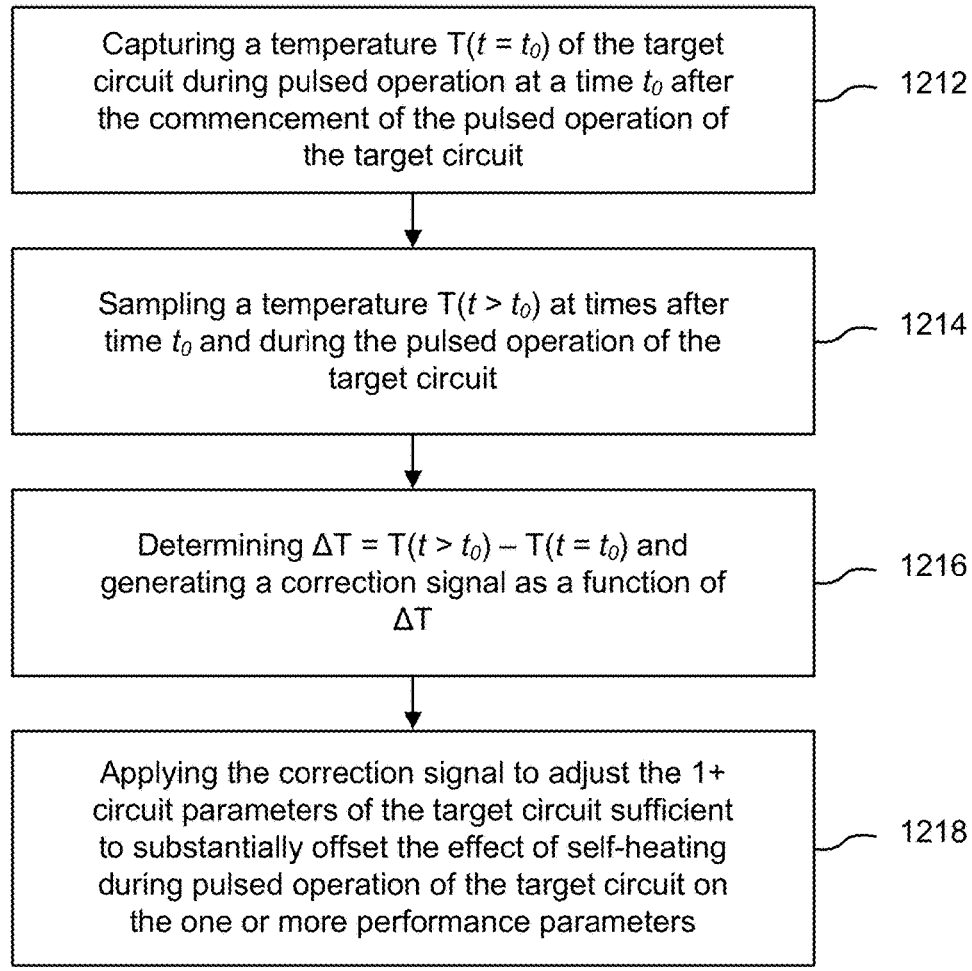
FIG. 12B is a process flow diagram of a second method for temperature compensating a target circuit having one or more performance parameters affected by self-heating during pulsed operation of the target circuit.

As another example, FIG. 12B is a process flow diagram 1210 of a second method for temperature compensating a target circuit having one or more performance parameters affected by self-heating during pulsed operation of the target circuit. The method steps include: capturing a temperature $T(t=t_0)$ of the target circuit during pulsed operation at a time $t_0$ after the commencement of the pulsed operation of the target circuit (STEP 1212); sampling a temperature $T(t>t_0)$ at times after time $t_0$ and during the pulsed operation of the target circuit (STEP 1214); determining $\Delta T = T(t>t_0) - T(t=t_0)$ and generating a correction signal as a function of $\Delta T$ (STEP 1216); and applying the correction signal to adjust the one or more circuit parameters of the target circuit sufficient to substantially offset the effect of self-heating during pulsed operation of the target circuit on the one or more performance parameters (STEP 1218).

Figure 12C:
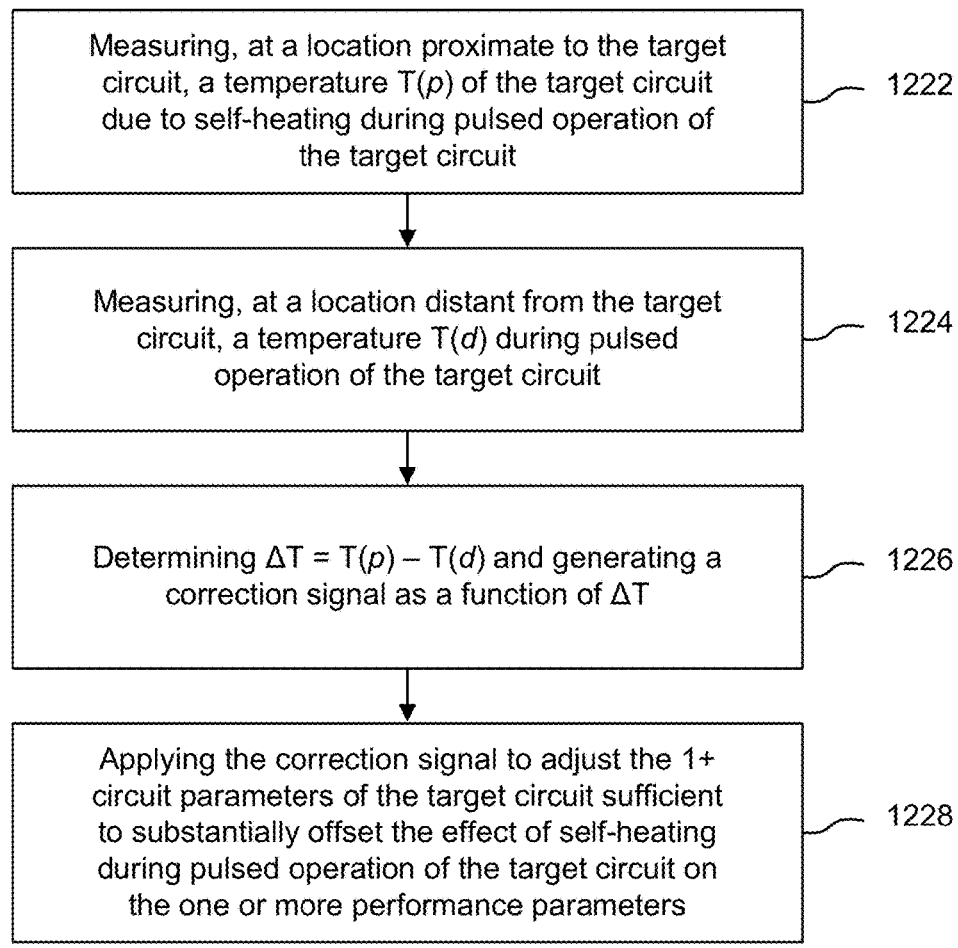
FIG. 12C is a process flow diagram of a third method for temperature compensating a target circuit having one or more performance parameters affected by self-heating during pulsed operation of the target circuit.

As yet another example, FIG. 12C is a process flow diagram 1220 of a third method for temperature compensating a target circuit having one or more performance parameters affected by self-heating during pulsed operation of the target circuit. The method steps include: measuring, at a location proximate to the target circuit, a temperature $T(p)$ of the target circuit due to self-heating during pulsed operation of the target circuit (STEP 1222); measuring, at a location distant from the target circuit, a temperature $T(d)$ during pulsed operation of the target circuit (STEP 1224); determining $\Delta T = T(p) - T(d)$ and generating a correction signal as a function of $\Delta T$ (STEP 1226); and applying the correction signal to adjust the one or more circuit parameters of the target circuit sufficient to substantially offset the effect of self-heating during pulsed operation of the target circuit on the one or more performance parameters (STEP 1228).

Variations of the above methods include sampling and holding $T(d)$ near the commencement of pulsed operation; the target circuit including a power amplifier and one of the performance parameters being at least one of a Gain or output power of the power amplifier during pulsed operation of the power amplifier; the target circuit including a power amplifier having at least one amplifier stage configured to receive an input radio frequency signal and output an amplified radio frequency signal, and the correction signal adjusting at least one of: a bias circuit for one or more amplifier stages; one or more impedance matching networks affecting the input radio frequency signal and/or the amplified radio frequency signal; one or more auxiliary amplifier stages for amplifying the input radio frequency signal and/or the amplified radio frequency signal; one or more attenuation circuits affecting the amplitude of the input radio frequency signal and/or the amplified radio frequency signal; one or more voltage and/or current supply circuits within or to the power amplifier.

Figure 12D:
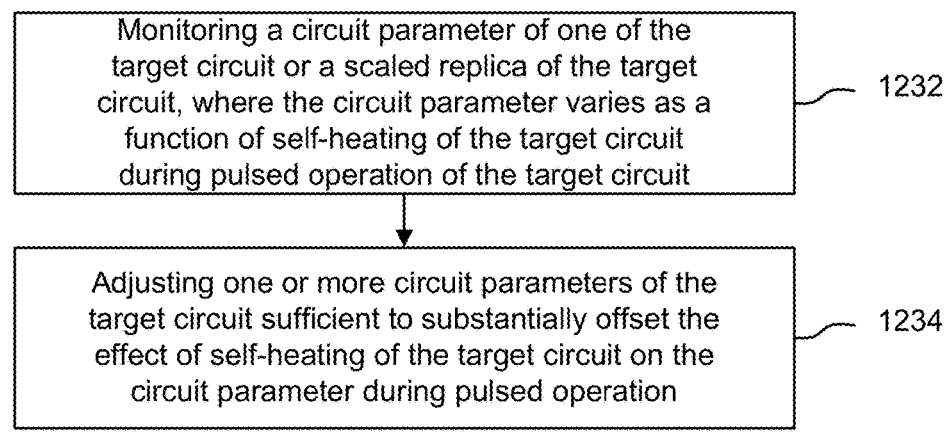
FIG. 12D is a process flow diagram of a method for temperature compensating a target circuit.

FIG. 12D is a process flow diagram 1230 of a method for temperature compensating a target circuit. The method includes: monitoring a circuit parameter of one of the target circuit or a scaled replica of the target circuit, where the circuit parameter varies as a function of self-heating of the target circuit during pulsed operation of the target circuit (STEP 1232); and adjusting one or more circuit parameters of the target circuit sufficient to substantially offset the effect of self-heating of the target circuit on the circuit parameter during pulsed operation (STEP 1234). A variation of this method includes the target circuit including a power amplifier and the monitored circuit parameter being a Gain of one of the power amplifier or at least one scaled replica of the power amplifier during pulsed operation of the power amplifier.

FIG. 12E is a process flow diagram 1240 of a method for temperature compensating an integrated circuit including (1) a power amplifier having a corresponding Gain that droops due to self-heating of the power amplifier during pulsed operation and (2) a temperature compensation circuit. The method includes: providing at least one scaled replica amplifier in close proximity to the power amplifier, each scaled replica amplifier having an input coupled to a reference signal and outputting an amplified reference signal, wherein each scaled replica amplifier has a corresponding Gain that droops due to self-heating of the power amplifier during pulsed operation of the power amplifier (STEP 1242); and providing a power measurement and correction circuit coupled to the reference signal and to the amplified reference signal, for determining a correction signal as a function of the reference signal and of the amplified reference signal, the correction signal being coupled to the power amplifier to adjust the Gain of the power amplifier sufficient to substantially offset the effect of self-heating of the power amplifier on the Gain of the power amplifier during pulsed operation of the power amplifier (STEP 1244).

Direct Regulation of Bias Signal

Another aspect of the invention includes bias compensation circuits that directly regulate a bias signal to an amplifier stage as a function of localized heating of one or more of amplifier stages. Such bias compensation circuits include physical placement of at least one bias compensation circuit element in closer proximity to at least one amplifier stage than other bias compensation circuit elements.

Figure 13:
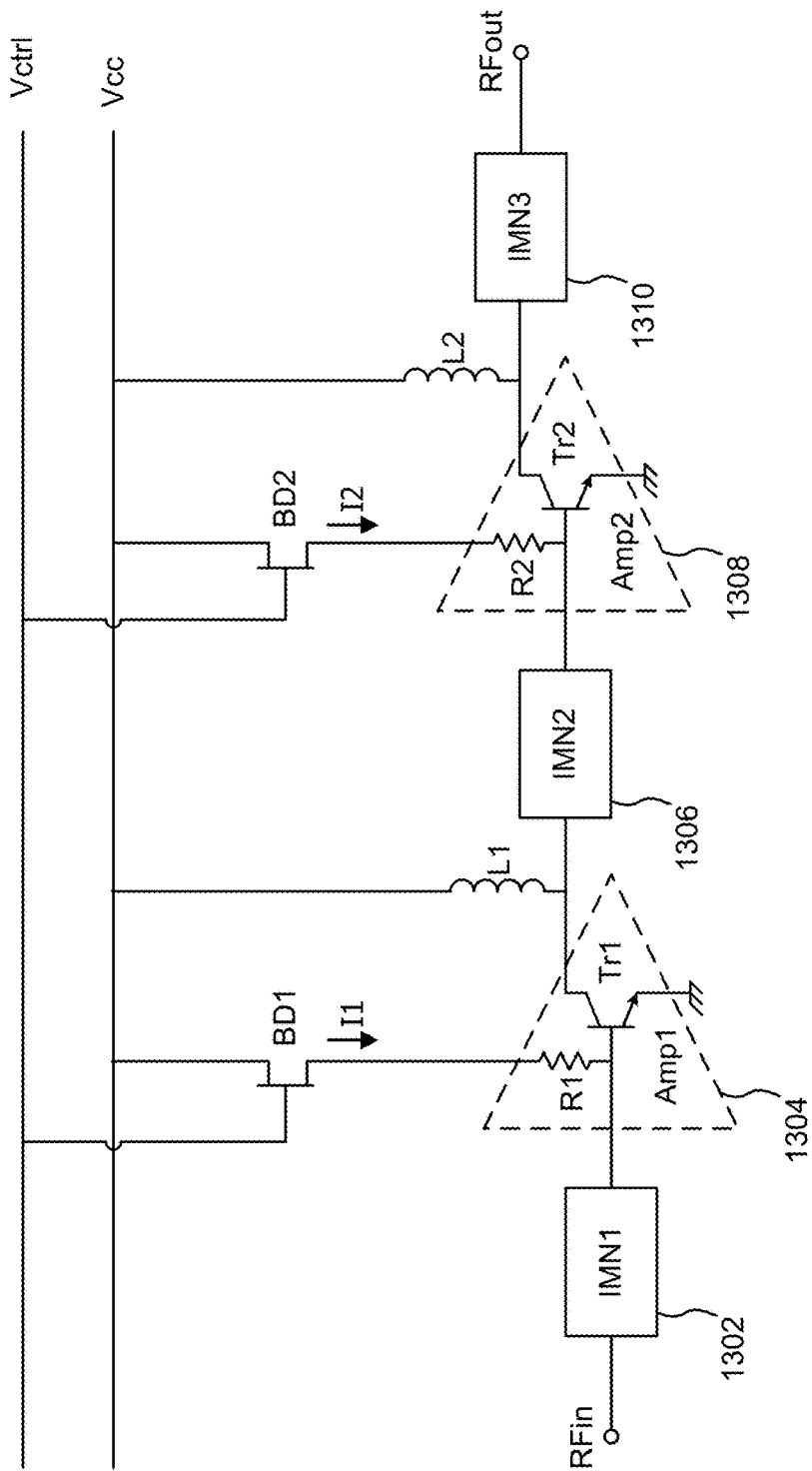
FIG. 13 is a schematic diagram of a prior art RF two-stage power amplifier and associated bias circuitry.

As further background on typical amplifier biasing, FIG. 13 is a schematic diagram of a prior art RF two-stage power amplifier (PA) and associated bias circuitry. In the illustrated example, a first impedance matching network (IMN1) 1302 impedance matches an input signal RFin to a first amplifier stage (Amp1) 1304 (often called a driver). A second impedance matching network (IMN2) 1306 couples the output of the first amplifier stage 1304 to a second amplifier stage (Amp2) 1308 (in this case, a final stage). The amplified RF output of the second amplifier stage 1308 is coupled to a third impedance matching network (IMN3) 1310, the output of which is RFout.

In the example circuit of FIG. 13, each amplifier stage 1304, 1308 internally includes at least a transistor Tr1, Tr2, such as a bipolar transistor (although other transistor types may be used). The transistors Tr1, Tr2 are each biased through a corresponding resistor R1, R2 coupled to a corresponding biasing device BD1, BD2, which are in turn coupled to a power supply voltage Vcc (e.g., from drain to source) and to a control voltage Vctrl (e.g., to a biasing device gate). The biasing devices BD1, BD2 may be, for example, field effect transistors (although other transistor types may be used, such as bipolar transistors). The control voltage Vctrl determines the amount of bias current I1, I2 respectively supplied by the biasing devices BD1, BD2 to their corresponding transistors Tr1, Tr2. In operation, each amplifier stage 1304, 1308 amplifies an applied RF signal at an operating point determined by the corresponding bias current I1, I2. A load current is coupled to the output of each amplifier stage 1304, 1308, and is generally supplied from the power supply voltage Vcc through a corresponding inductor L1, L2 to remove noise.

The power amplifier example shown in FIG. 13 has two amplifier stages, but other embodiments may have only one amplifier stage, or more than two amplifier stages. Further, the example power amplifier is simplified, and it should be understood that the illustrated circuit may be substantially more complex in practice, such as by using stacked transistors to withstand high voltages. One or more of the various IMN circuits 1302, 1305, 1310 may be implemented in a tunable configuration, such as by using tunable inductors and/or tunable capacitors; some of the IMN circuits may be optional for some embodiments; and in some embodiments, one or more of the IMN circuits may be off-chip circuits.

It is conventional for the final amplifier stage (e.g., Amp2) to provide the largest power output, and thus generate the greatest amount of heat while in operation compared to preceding stages. Preceding amplifier stages (e.g., Amp1) are generally smaller in size but have higher Gain than the final amplifier stage, but such preceding stages also generate some heat while in operation. In either case, as noted above, in operation, self-heating of a PA generally causes Gain to "droop"—that is, as the PA circuit warms up due to current flow through one or more amplifier stages 1304, 1308, Gain decreases over time, as shown in FIG. 4A. Such decrease in Gain is particularly problematic during pulsed operation when high linearity is required.

A. Current Mirror Bias Compensation Circuit

Figure 14A:
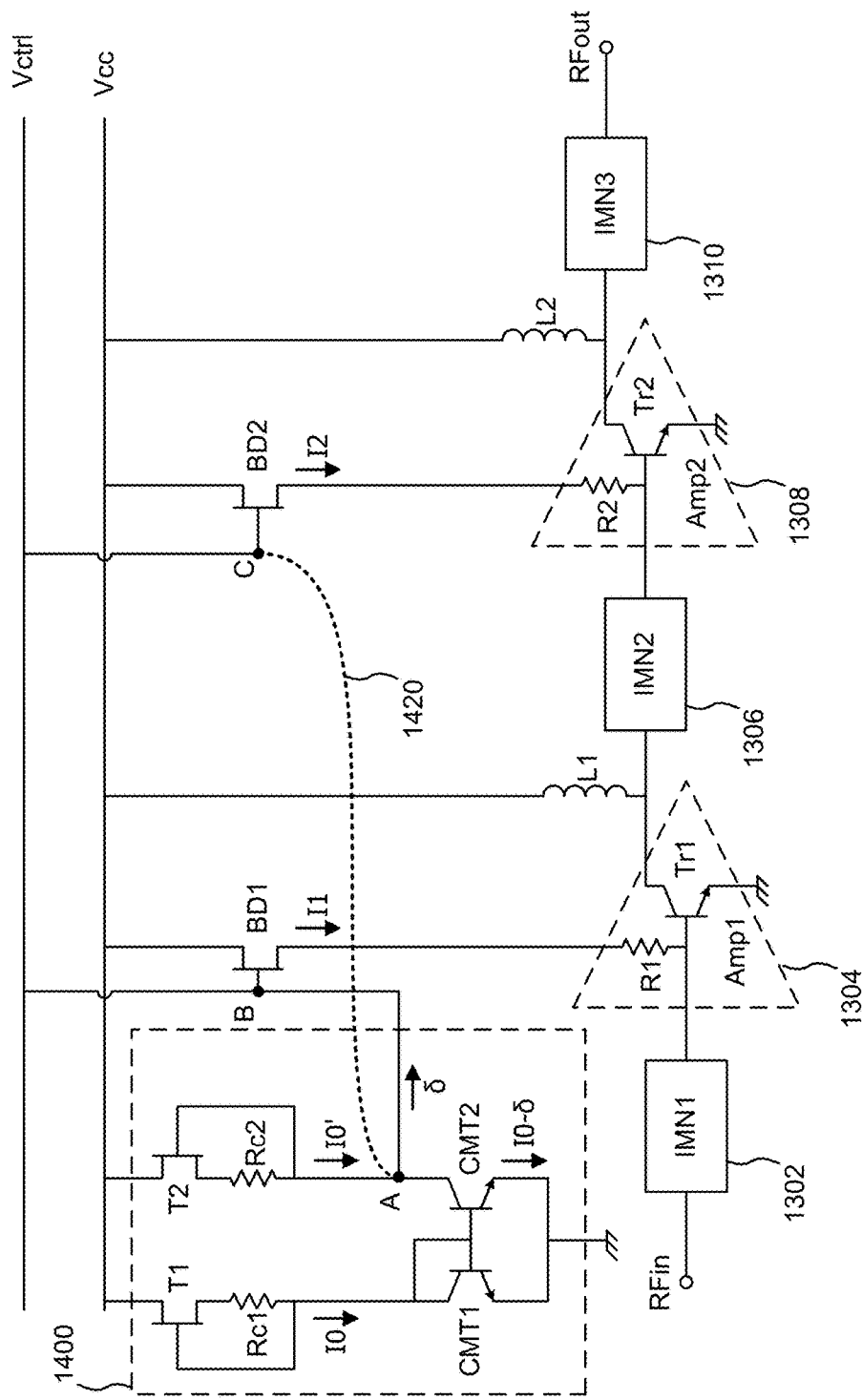
FIG. 14A is a schematic diagram of an example RF two-stage power amplifier (PA) having a bias compensation circuit that includes a temperature-sensitive current mirror circuit for regulating bias current to at least one amplifier stage.

In addition to, or in lieu of, using tracking circuits (e.g., sample and hold circuits), as in the embodiments described above, the bias circuits of a PA may be configured to directly regulate the bias current to an amplifier stage as a function of localized heating of one or more of amplifier stages. For example, FIG. 14A is a schematic diagram of an example RF two-stage power amplifier (PA) having a bias compensation circuit 1400 that includes a temperature-sensitive current mirror circuit for regulating bias current to at least one amplifier stage. The configuration of the amplifier circuitry from RF$_{IN}$ to RF$_{OUT}$ is the same as in FIG. 13. Each amplifier stage 1304, 1308 is similarly coupled to a corresponding biasing device BD1, BD2, which are in turn coupled to a power supply voltage Vcc and a control voltage Vctrl. The control voltage Vctrl determines the amount of bias current I1, I2 respectively supplied by the biasing devices BD1, BD2 to their corresponding amplifier stages 1304, 1308.

Figure 14B:
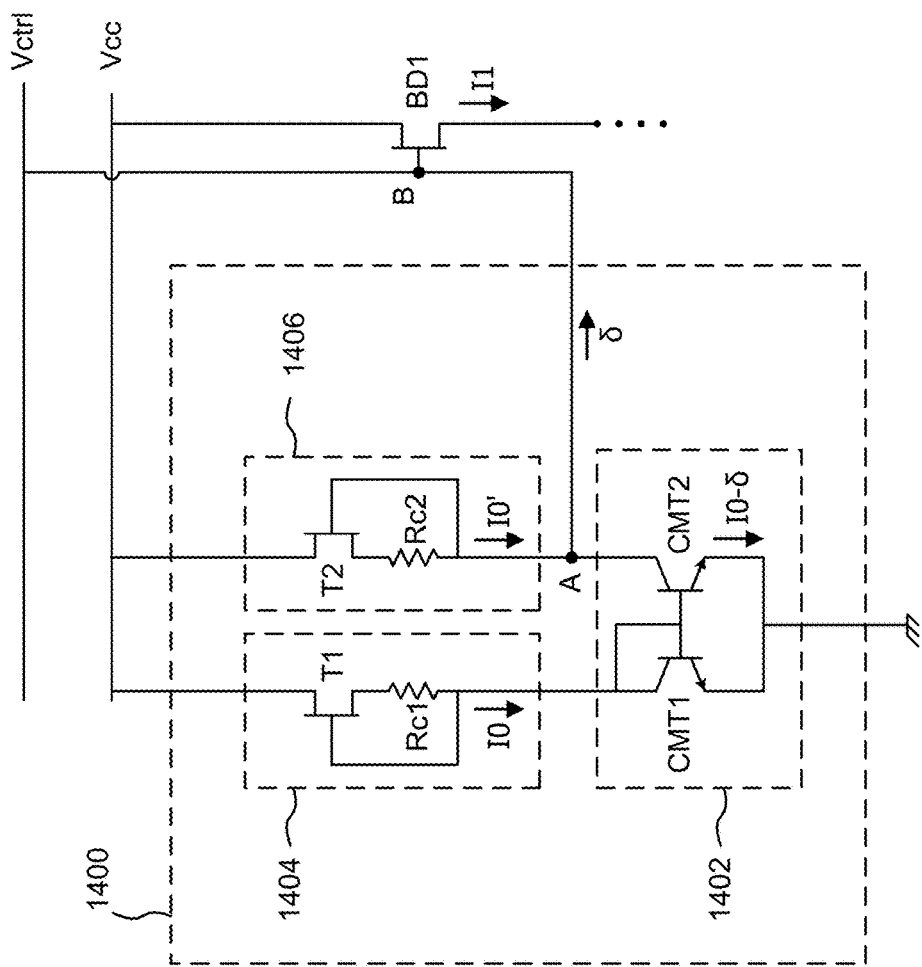
FIG. 14B is an enlarged version of the bias compensation circuit of FIG. 14A.

In addition, in the illustrated example, the biasing current to the first amplifier stage 1302 may be increased as a function of a correction or compensation signal δ generated by the bias compensation circuit 1400. In the example shown in FIG. 14A, an output connection node A of the bias compensation circuit 1400 is coupled to the gate of the biasing device BD1. FIG. 14B is an enlarged version of the bias compensation circuit 1400 of FIG. 14A. In the illustrated example, the bias compensation circuit 1400 includes a current mirror circuit 1402, a first constant current source 1404, and a second constant current source 1406. Each of the first constant current source 1404 and the second constant current source 1406 may be formed by using a normally-ON field effect transistor and a corresponding resistance device Rc1, Rc2. Each of the first constant current source 1404 and the second constant current source 1406 may be designed to output a current I0 of the same amount, but that characteristic is not a limitation, so long as both constant current sources 1404, 1406 output an essentially constant current. For the sake of discussion, in this example, the first constant current source 1404 outputs a current I0, the second constant current source 1406 outputs a current I0', and I0=I0'.

The current mirror circuit 1402 includes a first transistor CMT1 having an input coupled to the first constant current source 1404, and a second transistor CMT2 having an input coupled to the second constant current source 1406; the output of the second transistor CMT2 is output node A of the bias compensation circuit 1400. The first transistor CMT1 and the second transistor CMT2 may be field effect transistors and/or bipolar transistors. However, it may be beneficial to use a bipolar transistor for at least the first transistor CMT1. In general, a bipolar transistor has a larger temperature coefficient for a current amount than a field effect transistor, and thus a temperature difference between the first transistor CMT1 and the second transistor CMT2 due to operational heating of one or more amplifier stage 1304, 1308 may be more effectively determined. For purposes of this disclosure, and by way of example only, it is assumed that both the first transistor CMT1 and the second transistor CMT2 are bipolar transistors.

As described below in greater detail, the first transistor CMT1 is physically positioned in closer proximity to at least one amplifier stage 1304, 1308 than the second transistor CMT2. When the temperature of the first transistor CMT1 is equal to that of the second transistor CMT2, the amount of current I0 flowing through the first transistor CMT1 also flows through the second transistor CMT2 (i.e., the current through the first transistor CMT1 is mirrored through the second transistor CMT2). Thus, the difference current δ is equal to zero, and no current is output from node A between the second constant current source 1406 and the second transistor CMT2. In contrast, a temperature increase in the first transistor CMT1 causes a decrease in the base voltage of the first transistor CMT1. The current flowing through the second transistor CMT2 decreases to I0−δ, and the non-zero difference current δ is output from node A. More simply put, a temperature-induced current difference between CMT1 and CMT2 will result in a difference current δ which adjusts the bias current I1 and/or I2 to a corresponding amplifier stage 1304, 1308.

In the examples shown in FIGS. 14A and 14B, node A of the bias compensation circuit 1400 is connected at a node B to the control gate of the bias device BD1 for the first amplifier stage 1304; in some embodiments, the difference current δ supplied from node A of the bias compensation circuit 1400 may be converted to a control voltage δ for the bias device BD1, for example, by using a shunt resistor (not illustrated). The bias device BD1 supplies a bias current I1 to the first amplifier stage 1304; the bias current I1 increases with an increase in the difference signal S. Thus, the value of I1 is a function of the temperature of the first transistor CMT1 relative to the temperature of the second transistor CMT2. Accordingly, as the temperature of the first transistor CMT1 increases, the bias current I1 to the first amplifier stage 1304 increases, and the Gain of the first amplifier stage 1304 increases, thereby offsetting Gain droop.

Figure 14C:
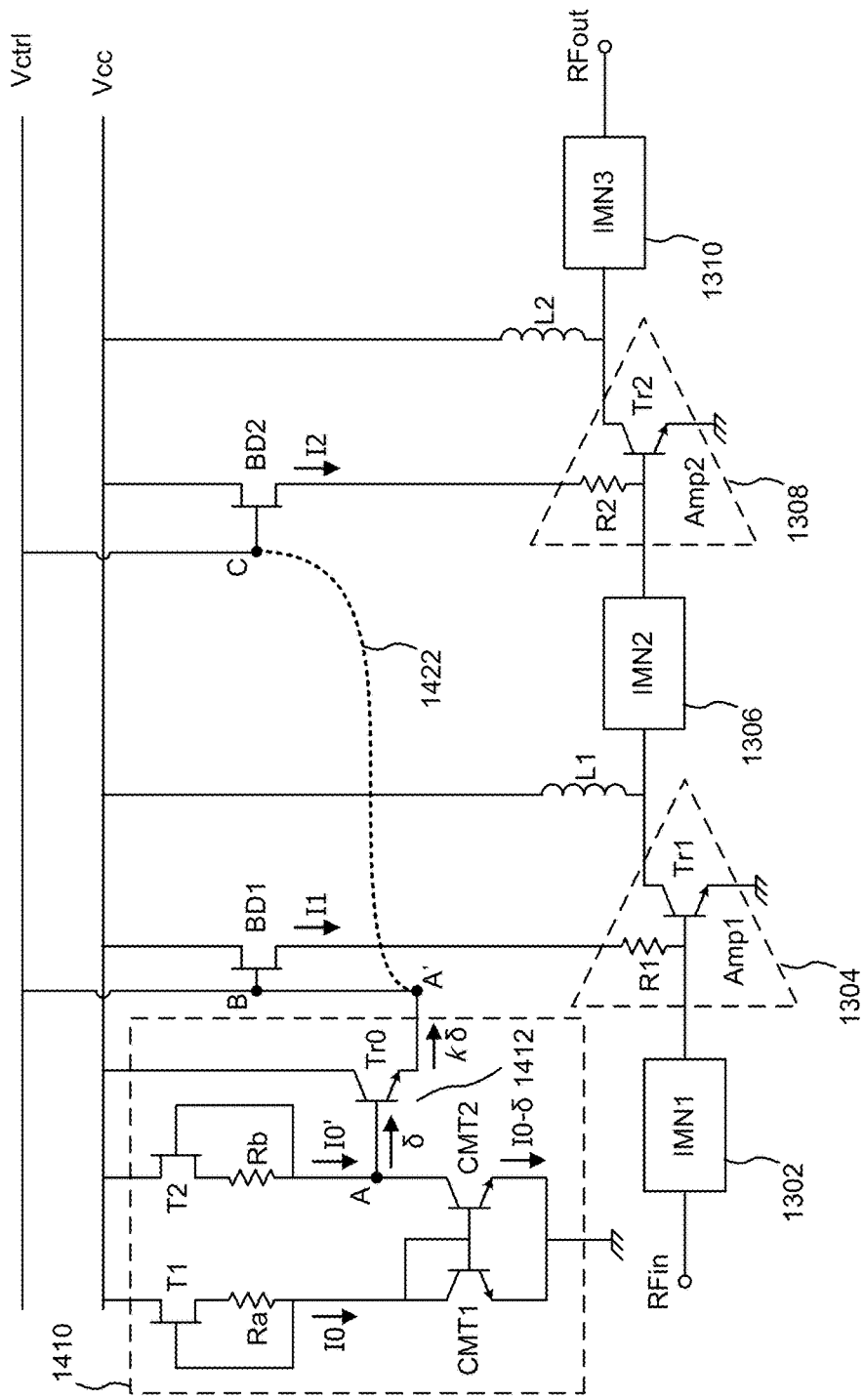
FIG. 14C is a schematic diagram of an example RF two-stage power amplifier (PA) having a bias compensation circuit that includes a temperature-sensitive current mirror circuit having an amplified difference current δ.

FIG. 14C is a schematic diagram of an example RF two-stage power amplifier (PA) having a bias compensation circuit 1410 that includes a temperature-sensitive current mirror circuit having an amplified difference current S. While quite similar to the bias compensation circuit 1400 of FIGS. 14A and 14B, the bias compensation circuit 1410 of FIG. 14C further includes an output amplifier device 1412, shown in this example as a transistor Tr0. However, the output amplifier device 1412 may be implemented by other circuitry to perform the same amplification function.

As shown in the illustrated example, the output amplifier device 1412 is coupled to node A of the bias compensation circuit 1410 and has an output at a node A'. The output node A' is coupled to a control input of a bias device (e.g., node B of BD1) in lieu of node A. The output amplifier device 1412 amplifies any applied difference current δ by an amplification factor k, resulting in an output bias compensation current having a value of kδ. One benefit of the bias compensation circuit 1410 is that the output amplifier device 1412 enables an amplified amount of bias compensation current to be supplied to a coupled bias device while allowing the currents I0, I0' flowing through the first transistor CMT1 and the second transistor CMT2 to be lower. Lower current results in less self-heating for the first transistor CMT1 and the second transistor CMT2, as well as smaller transistor sizes, thus consuming less area on an integrated circuit.

Variations of the circuit of FIGS. 14A and 14C may be used as well. For example, while nodes A, A' of each of the bias compensation circuits 1400, 1410 of FIGS. 14A and 14C are described above as connected to node B, in alternative embodiments, node A or A' instead may be coupled at a node C to the control gate of the bias device BD2 for the second amplifier stage 1308, as suggested by the dotted lines 1420 in FIG. 14A and 1422 in FIG. 14C. Accordingly, any difference signal (δ or kδ) supplied from nodes A, A' would alter the bias current I2 to the second amplifier stage 1308, thereby increasing the Gain of the second amplifier stage 1308 to offset Gain droop.

In yet another embodiment, a single bias compensation circuit 1400, 1410 may be configured so that its respective node A or A' is coupled to more than one bias device (e.g., to node B of BD1 and to node C of BD2) to regulate the bias currents I1, I2 provided to the amplifier stages 1304, 1308 as a function of the temperature difference between the first transistor CMT1 and the second transistor CMT2. Alternatively, a separate bias compensation circuit 1400, 1410 may be coupled to each of the bias devices BD1, BD2 in order to individually regulate the bias currents I1, I2 provided to the amplifier stages 1304, 1308.

Figure 15:
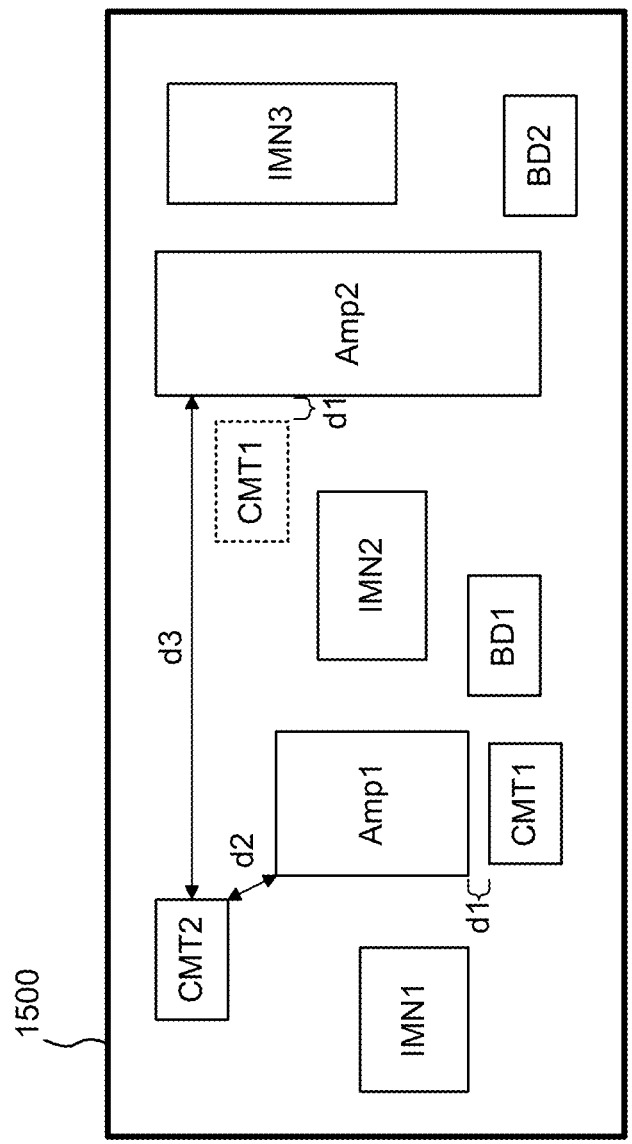
FIG. 15 is a simplified plan view of the layout on an integrated circuit die of circuit components for an example RF two-stage power amplifier (PA) having a bias compensation circuit of the type shown in FIG. 14A or FIG. 14C.

As noted above, the first transistor CMT1 is physically positioned in closer proximity to at least one amplifier stage 1304, 1308 than the second transistor CMT2. For example, FIG. 15 is a simplified plan view of the layout on an integrated circuit die 1500 of circuit components for an example RF two-stage power amplifier (PA) having a bias compensation circuit 1400, 1410 of the type shown in FIG. 14A or FIG. 14C. The component labels in FIG. 15 correspond to the component labels in FIGS. 14A and 14C.

In the illustrated example, the first transistor CMT1 is positioned at a distance of d1 from the first amplifier stage Amp1. The second transistor CMT2 is positioned at a distance of d2 from the first amplifier stage Amp1 and at a distance of d3 from the second amplifier stage Amp2 (generally the largest heat producer), such that d1<d2<d3. Thus, as the first amplifier stage Amp1 heats up, the first transistor CMT1 will be affected by the self-heating of the first amplifier stage Amp1 faster than the second transistor CMT2 is affected by either amplifier stage. Accordingly, the current mirror circuit 1402 of the bias compensation circuit 1400, 1410 will generate a difference signal δ or kδ as a function of the difference in temperatures between the first transistor CMT1 and the second transistor CMT2. As described above, the difference current may be applied (directly or in amplified form) to one or more of the biasing devices BD1, BD2 to alter (e.g., increase) the bias current supplied to one or more of the amplifier stages 1304, 1308, thereby increasing the Gain of one or both of the amplifier stages 1304, 1308 to offset heat-induced Gain droop.

In an alternative embodiment, the first transistor CMT1 is shown positioned at a distance of d1 from the second amplifier stage Amp2 (as indicated by the dotted outline for the first transistor CMT1). Again, the second transistor CMT2 is positioned at a distance of d2 from the first amplifier stage Amp1 and at a distance of d3 from the second amplifier stage Amp2, such that d1<d3 (in addition, preferably, d1<d2). Thus, as the second amplifier stage Amp2 heats up, the first transistor CMT1 will be affected by the self-heating of the second amplifier stage Amp2 faster than the second transistor CMT2 is affected. Again, the current mirror circuit 1402 will generate a difference signal δ or kδ as a function of the difference in temperatures between the first transistor CMT1 and the second transistor CMT2, which may be applied (directly or in amplified form) to one or more of the biasing devices BD1, BD2 to alter (e.g., increase) the bias current supplied to one or more of the amplifier stages 1304, 1308 to offset heat-induced Gain droop.

More generally, the first transistor CMT1 should be positioned in closer proximity to at least one heat-producing amplifier stage than the second transistor CMT2, and the second transistor CMT2 should be positioned at a distance from all heat-producing amplifier stages that significantly lessens the influence of heating from such amplifier stages compared to the heat influencing the first transistor CMT1. In any case, it is generally beneficial to dispose the first transistor CMT1 adjacent to an amplifier stage without intervening circuit components so as to react quickly to temperature changes in the adjacent amplifier stage.

As noted above, the final amplifier stage generally provides the largest power output, and thus generates the greatest amount of heat while in operation compared to preceding amplifier stages. Preceding amplifier stages are generally smaller in size but have higher Gain than the final amplifier stage. Accordingly, in the example shown in FIG. 15, it may be beneficial to position the first transistor CMT1 near a higher power amplifier stage (e.g., the second amplifier stage Amp2), but use the difference current generated by the current mirror circuit 1402 to regulate the bias current to a higher-Gain preceding amplifier stage (e.g., the first amplifier stage Amp1) to offset Gain droop. For example, the first transistor CMT1 may be positioned nearer to the second amplifier stage Amp2 than to the second transistor CMT2, and the difference signal δ from the current mirror circuit 1402 may regulate the bias current I1 from the biasing device BD1 to the first amplifier stage Amp1. However, as should be clear, other circuit embodiments can be made with different combinations of placements for the first transistor CMT1 relative to the second transistor CMT2 and the amplifier stages 1304, 1308, and of control nodes for regulating a bias current to an amplifier stage to offset Gain droop as a function of the difference current output from one or more bias compensation circuits 1400, 1410.

A notable aspect of the bias compensation circuits 1400, 1410 is that, since each amplifier stage 1304, 1308 generally self-heats during operation, it may be useful to over-compensate the Gain droop of a preceding amplifier stage (e.g., the first amplifier stage Amp1) so as to pre-correct for the Gain droop of a succeeding amplifier stage (e.g., the second amplifier stage Amp2). This may be accomplished, for example, by sizing components so as to cause the difference signal δ or the amplified difference signal kδ to "over correct" the bias current of a preceding amplifier stage (as a function of the difference in temperature between the first transistor CMT1 and the second transistor CMT2) sufficiently to just compensate for the Gain droop of a succeeding amplifier stage.

Of note, the bias compensation circuits 1400, 1410 may be used in conjunction with one or more embodiments described above for generating Gain Control signals which may be applied to other components of an amplifier circuit whose parameters may be adjusted to offset Gain droop of the amplifier circuit, such as those shown in FIG. 5. Thus, for example, one or more of the bias compensation circuits 1400, 1410 may be used to provide a Gain droop offset for the first amplifier (driver) stage 512 and/or the second amplifier (final) stage 514 of FIG. 5, while one or more of the temperature or gain tracking circuits of FIG. 3, 6A, 7, 8, 9, or 10 may be used to provide a Gain droop offset in one or more of the other components of FIG. 5 (e.g., the IMN and/or variable attenuator circuits 504, 506, 508). As should be clear, other combinations of Gain Control offset circuits coupled to Gain Control offset points, such as those shown in FIG. 5, can be combined with the bias compensation circuits 1400, 1410 of FIGS. 14A and 14C.

The bias compensation circuits 1400, 1410 may be beneficially configured as differential circuits having a symmetrical structure (other than placement of the first transistor CMT1 relative to the second transistor CMT2 in the current mirror circuit 1402). Therefore, the bias compensation circuits 1400, 1410 are unlikely to be adversely influenced by temperature and process variations, and thus easily achieve excellent circuit characteristics.

B. PTC Bias Compensation Circuit

Figure 16:
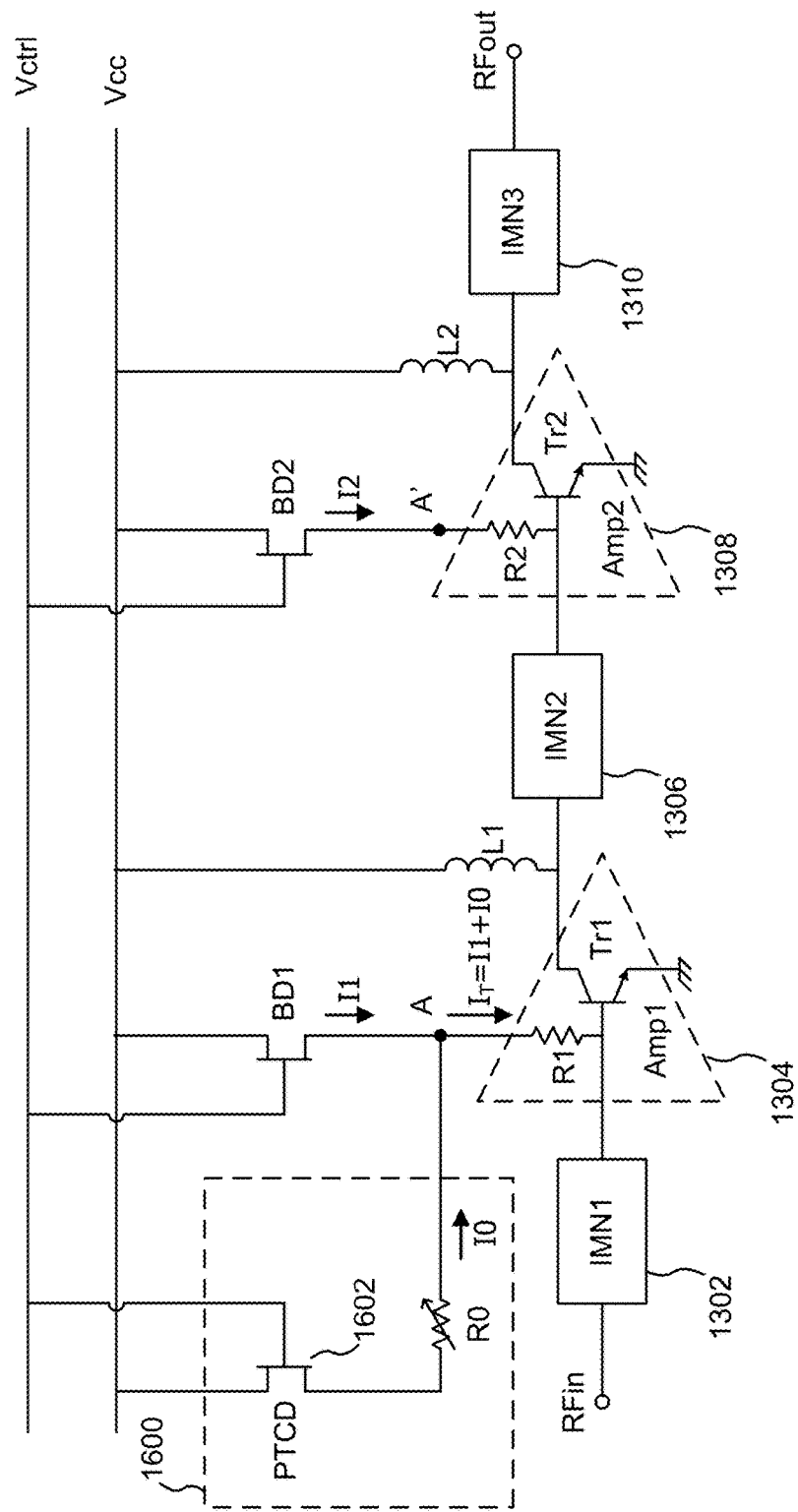
FIG. 16 is a schematic diagram of an example RF two-stage power amplifier (PA) having a bias compensation circuit that includes a temperature-sensitive element with a positive temperature coefficient (PTC) for regulating bias current to at least one amplifier stage.

As noted above, in addition to, or in lieu of, using tracking circuits (e.g., sample and hold circuits), the bias circuits of a PA may be configured to directly regulate the bias current to an amplifier stage as a function of localized heating of one or more of amplifier stages. For example, FIG. 16 is a schematic diagram of an example RF two-stage power amplifier (PA) having a bias compensation circuit 1600 that includes a temperature-sensitive element with a positive temperature coefficient (PTC) for regulating bias current to at least one amplifier stage. The configuration of the amplifier circuitry from $RF_{IN}$ to $RF_{OUT}$ is the same as in FIG. 13. Each amplifier stage 1304, 1308 is similarly coupled to a corresponding biasing device BD1, BD2, which are in turn coupled to a power supply voltage Vcc and a control voltage Vctrl. The control voltage Vctrl determines the amount of bias current I1, I2 respectively supplied by the biasing devices BD1, BD2 to their corresponding amplifier stages 1304, 1308.

In addition, in the illustrated example, the biasing current to an amplifier stage may be increased by a compensating current I0 generated by the bias compensation circuit 1600 to offset Gain droop. In the example shown in FIG. 16, the output I0 of the bias compensation circuit 1600 is coupled in parallel at node A with the output I1 of the biasing device BD1 to provide a total bias current $I_T=I1+I0$ to the first amplifier stage 1304. In other embodiments, the bias compensation circuit 1600 may be coupled in parallel at node A' with the output I2 of the biasing device BD2 to provide a total bias current $I_T=I2+I0$ to the second amplifier stage 1308. In still other embodiments, each biasing device BD1, BD2 may be coupled in parallel with a corresponding bias compensation circuit 1600.

In greater detail, the bias compensation circuit 1600 includes a positive temperature coefficient device (PTCD) 1602 series-coupled between a power supply voltage Vcc and an optional resistor R0, which may be a fixed, settable (e.g., during manufacture or post-manufacture testing or installation), or variable resistor. The PTCD 1602 may be a field effect transistor or a bipolar transistor, or may be a two-terminal diode, or a similar device or circuit, so long as the implementing device or circuit has the characteristic that current flow through the device or circuit increases as its temperature increases. In the example illustrated in FIG. 16, the PTCD 1602 is depicted as a field effect transistor (FET) having its gate coupled to the control voltage Vctrl. As is known in the art, for a FET having a PTC, an increase in the temperature of the FET causes a decrease in the threshold voltage Vth of the FET. Therefore, the effective control voltage Vctl−Vth to the FET is increased, thus increasing the output current of the FET.

As described below in greater detail, the PTCD 1602 is physically positioned in closer proximity to at least one amplifier stage 1304, 1308 than the corresponding biasing device BD1, BD2 coupled in parallel with the bias compensation circuit 1600. As the temperature of the PTCD 1602 increases, the amount of current I0 passing through the PTCD 1602 increases, and accordingly the total bias current provided to the corresponding amplifier stage 1304, 1308 is increased, thereby offsetting its Gain droop.

The amount of current I0 from each bias compensation circuit 1600 can be regulated by setting the resistance of the resistor R0 (if present) to a desired value. The resistance of resistor R0 may be set at the time of manufacture of an integrated circuit embodiment of the circuit shown in FIG. 16, or may be set during a post-manufacture calibration phase or circuit board assembly phase, or may be dynamically varied under program control in a complete system.

Variations of the circuit of FIG. 16 may be used as well. For example, a single bias compensation circuit 1600 may be configured so that it is coupled to a respective node A or A' of more than one bias device BD1, BD2) to supplement the bias currents I1, I2 provided to the amplifier stages 1304, 1308.

Figure 17:
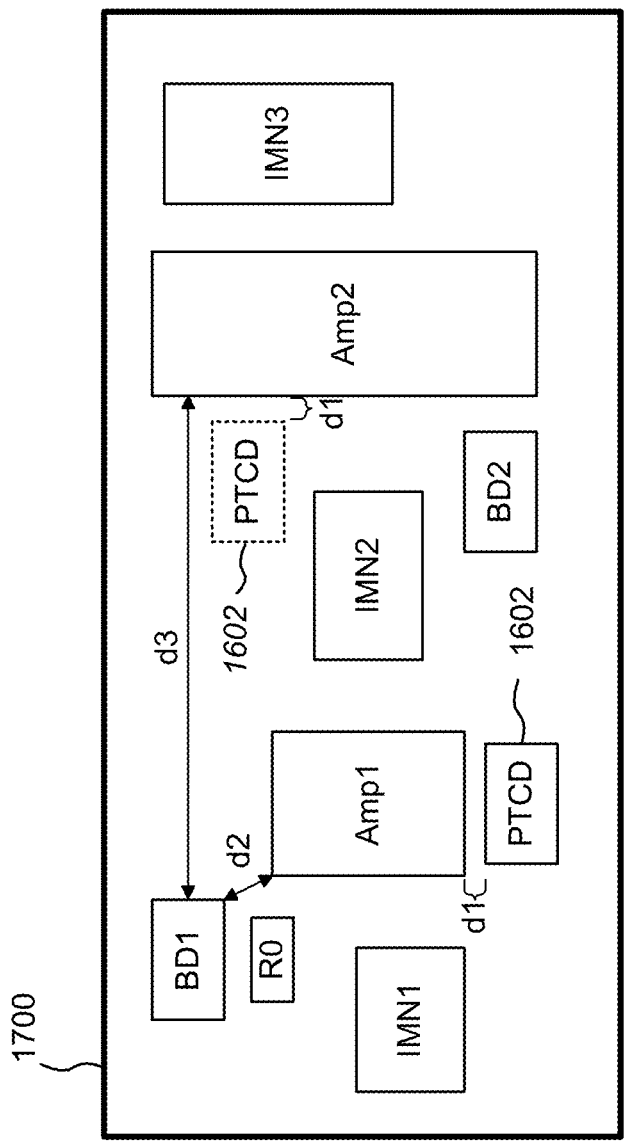
FIG. 17 is a simplified plan view of the layout on an integrated circuit die of circuit components for an example RF two-stage power amplifier (PA) having a bias compensation circuit of the type shown in FIG. 16.

As noted above, the PTCD 1602 is physically positioned in closer proximity to at least one amplifier stage 1304, 1308 than the corresponding biasing device BD1, BD2 coupled in parallel with the bias compensation circuit 1600. For example, FIG. 17 is a simplified plan view of the layout on an integrated circuit die 1700 of circuit components for an example RF two-stage power amplifier (PA) having a bias compensation circuit 1600 of the type shown in FIG. 16. The component labels in FIG. 17 correspond to the component labels in FIG. 16.

In the illustrated example, the PTCD 1602 is positioned at a distance of d1 from the first amplifier stage Amp1. In this example, the PTCD 1602 is paired with the biasing device BD1, which is positioned at a distance of d2 from the first amplifier stage Amp1 and at a distance of d3 from the second amplifier stage Amp2 (generally the largest heat producer), such that d1<d2<d3. Thus, as the first amplifier stage Amp1 heats up, the PTCD 1602 will be affected by the self-heating of the first amplifier stage Amp1 faster than the biasing device BD1 is affected. Accordingly, the bias compensation circuit 1600 will generate a correction or compensation current I0 as a function of the temperature of the PTCD 1602, and thus effectively as the difference in temperatures between the PTCD 1602 and the biasing device BD1.

As should be clear, the compensation current I0 may be applied (directly or in an amplified form) to one or more of the biasing devices BD1, BD2 to alter (e.g., increase) the bias current supplied to one or more of the amplifier stages 1304, 1308, thereby increasing the Gain of one or both of the amplifier stages 1304, 1308 to offset heat-induced Gain droop.

In an alternative embodiment, the PTCD 1602 is shown positioned at a distance of d1 from the second amplifier stage Amp2 (as indicated by the dotted outline for the PTCD 1602). Again, the biasing device BD1 is positioned at a distance of d2 from the first amplifier stage Amp1 and at a distance of d3 from the second amplifier stage Amp2, such that d1<d3 (in addition, preferably, d1<d2). Thus, as the biasing device BD1 heats up, the PTCD 1602 will be affected by the self-heating of the second amplifier stage Amp2 faster than the biasing device BD1 is affected. Again, the bias compensation circuit 1600 will generate a compensation current I0 as a function of the temperature of the PTCD 1602, and thus effectively as the difference in temperatures between the PTCD 1602 and the biasing device BD1. The compensation current I0 may be applied (directly or in an amplified form) to one or more of the biasing devices BD1, BD2 to alter (e.g., increase) the bias current supplied to one or more of the amplifier stages 1304, 1308 to offset heat-induced Gain droop.

More generally, the PTCD 1602 should be positioned in closer proximity to at least one heat-producing amplifier stage than the corresponding paired biasing device BD1, BD2, and the corresponding paired biasing device BD1, BD2 should be positioned at a distance from all heat-producing amplifier stages that significantly lessens the influence of heating from such amplifier stages compared to the heat influencing the PTCD 1602. In any case, it is generally beneficial to dispose the PTCD 1602 adjacent to an amplifier stage without intervening circuit components so as to react quickly to temperature changes in the adjacent amplifier stage.

In the example shown in FIG. 17, it may be beneficial to position the PTCD 1602 near a higher power amplifier stage (e.g., the second amplifier stage Amp2), but use the supplemental compensation current I0 generated by the bias compensation circuit 1600 to regulate the bias current to a higher-Gain preceding amplifier stage (e.g., the first amplifier stage Amp1) to offset Gain droop. For example, the PTCD 1602 may be positioned nearer to the second amplifier stage Amp2 than to the biasing device BD1, and the compensation current I0 from the bias compensation circuit 1600 may supplement the bias current I1 from the biasing device BD1 to the first amplifier stage Amp1. However, as should be clear, other circuit embodiments can be made with different combinations of placements for the PTCD 1602 relative to the biasing devices BD1, BD2 and the corresponding amplifier stages 1304, 1308, and of control nodes for supplementing a bias current to an amplifier stage to offset Gain droop as a function of the compensation current I0 output from one or more bias compensation circuits 1600.

A notable aspect of the bias compensation circuit 1600 is that, since each amplifier stage 1304, 1308 self-heats during operation, it may be useful to over-compensate the Gain droop of a preceding amplifier stage (e.g., the first amplifier stage Amp1) so as to pre-correct the Gain droop of a succeeding amplifier stage (e.g., the second amplifier stage Amp2). This may be accomplished, for example, by sizing components so as to cause the supplemental compensation current I0 to "over correct" the total bias current applied to a preceding amplifier stage sufficiently to just compensate for the Gain droop of a succeeding amplifier stage.

As noted above, the bias compensation circuit 1600 may be used in conjunction with one or more embodiments described above for generating Gain Control signals which may be applied to other components of an amplifier circuit whose parameters may be adjusted to offset Gain droop of the amplifier circuit, such as those shown in FIG. 5. Thus, for example, one or more of the bias compensation circuit 1600 may be used to provide a Gain droop offset for the first amplifier (driver) stage 512 and/or the second amplifier (final) stage 514 of FIG. 5, while one or more of the temperature or gain tracking circuits of FIG. 3, 6A, 7, 8, 9, or 10 may be used to provide a Gain droop offset in one or more of the other components of FIG. 5 (e.g., the IMN and/or variable attenuator circuits 504, 506, 508). As should be clear, other combinations of Gain Control offset circuits coupled to Gain Control offset points, such as those shown in FIG. 5, can be combined with the bias compensation circuit 1600 of FIG. 16.

Applications

In some embodiments, the amplifier stages 1304, 1308 may be implemented with devices that exhibit an increase in Gain as temperature increases, rather than a decrease in Gain as temperature increases. In such a case, as one of ordinary skill in the art would appreciate, the Gain Control and bias compensation circuits described above may be readily adapted to provide a corresponding Gain offset, such as by decreasing the amount of bias current provided to such amplifier stages as a function of temperature increase.

Circuits and devices in accordance with the present invention may be used alone or in combination with other components, circuits, and devices. Embodiments of the present invention may be fabricated as integrated circuits (ICs), which may be encased in IC packages and/or or modules for ease of handling, manufacture, and/or improved performance. In some embodiments, the bias circuitry and bias circuits may be fabricated on an IC and configured to be coupled to one or more external (to that IC) amplifier stages.

Embodiments of the present invention are useful in a wide variety of larger radio frequency (RF) circuits and systems for performing a range of functions, including (but not limited to) power amplifiers and low-noise amplifiers (LNAs). Such functions are useful in a variety of applications, such as radar systems (including phased array and automotive radar systems), radio systems (including cellular radio systems), and test equipment. Such circuits may be useful in systems operating over some or all of the RF range (e.g., from around 20 kHz to about 300 GHz).

Radio system usage includes wireless RF systems (including base stations, relay stations, and hand-held transceivers) that use various technologies and protocols, including various types of orthogonal frequency-division multiplexing ("ODFM"), quadrature amplitude modulation ("QAM"), Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution (EDGE), Long Term Evolution ("LTE"), as well as other radio communication standards and protocols.

An important aspect of any RF system is in the details of how the component elements of the system perform. Any system that requires highly accurate gain control of an amplifier circuit, particularly during operational periods in which self-heating is a problem, may benefit significantly from use of the Gain Control and/or bias compensation circuits of the present invention.

Figure 18:
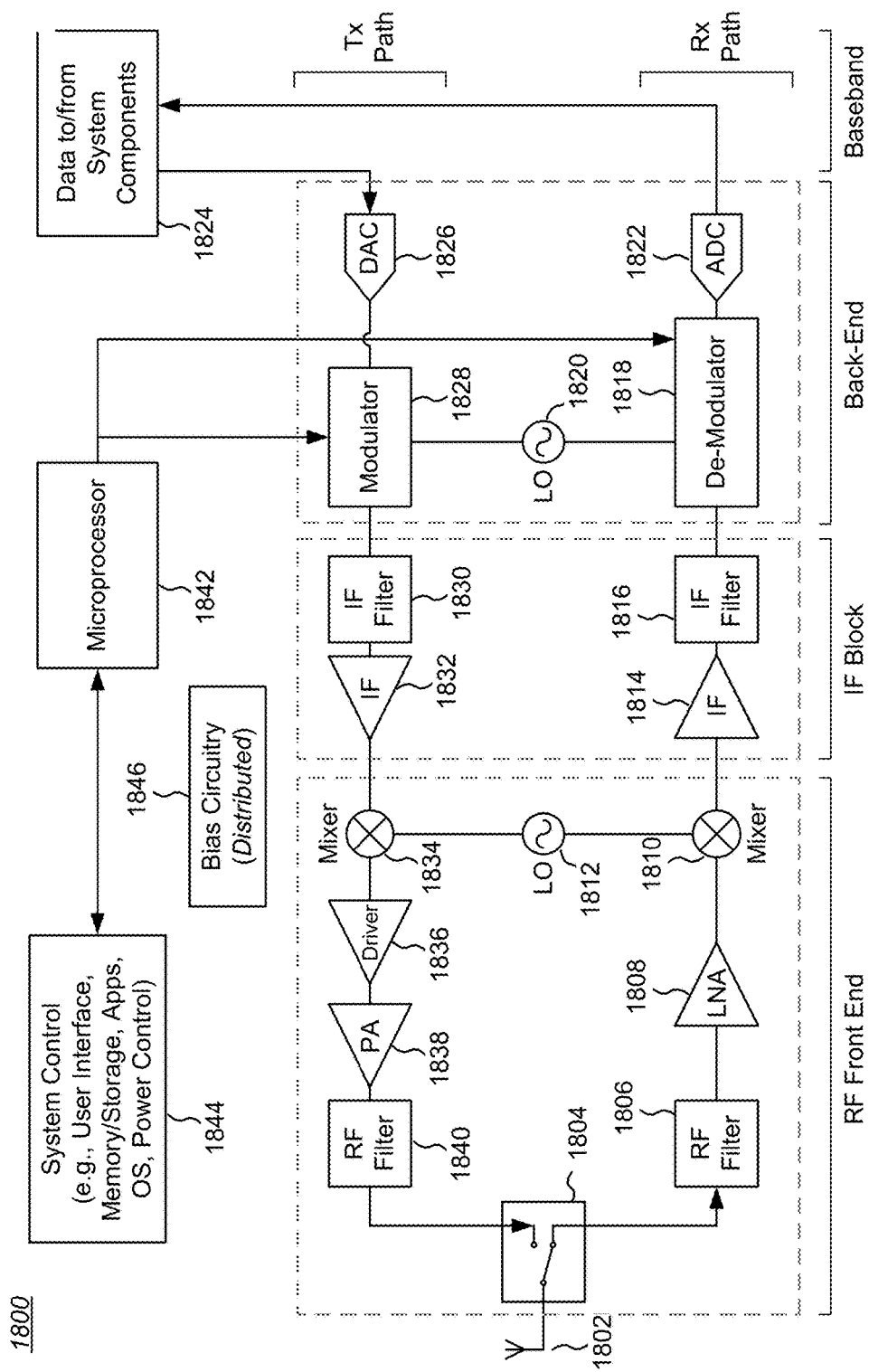
FIG. 18 is a block diagram of a typical transceiver that might be used in a wireless device, such as a cellular telephone, and which may beneficially employ embodiments of the invention.

For example, FIG. 18 is a block diagram of a typical transceiver 1800 that might be used in a wireless device, such as a cellular telephone, and which may beneficially employ embodiments of the present invention. As illustrated, the transceiver 1800 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 1802 and a switching unit 1804, which may be implemented with active switching devices (e.g., field effect transistors or FETs), or with passive devices that implement frequency-domain multiplexing, such as a diplexer or duplexer. An RF filter 1806 passes desired received RF signals to a low noise amplifier (LNA) 1808, the linearity or gain of which may be improved by application of the Gain Control and/or bias compensation circuits of the present invention. The output of the LNA 1808 is combined in a mixer 1810 with the output of a first local oscillator 1812 to produce an intermediate frequency (IF) signal. The IF signal may be amplified by an IF amplifier 1814 and subjected to an IF filter 1816 before being applied to a demodulator 1818, which may be coupled to a second local oscillator 1820. The demodulated output of the demodulator 1818 is transformed to a digital signal by an analog-to-digital converter 1822 and provided to one or more system components 1824 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 1824 is transformed to an analog signal by a digital-to-analog converter 1826, the output of which is applied to a modulator 1828, which also may be coupled to the second local oscillator 1820. The modulated output of the modulator 1828 may be subjected to an IF filter 1830 before being amplified by an IF amplifier 1832. The output of the IF amplifier 1832 is then combined in a mixer 1834 with the output of the first local oscillator 1812 to produce an RF signal. The RF signal may be amplified by a driver 1836, the output of which is applied to a power amplifier (PA) 1838, the linearity or gain of which may be improved by application of the Gain Control and/or bias compensation circuits of the present invention. The amplified RF signal may be coupled to an RF filter 1840, the output of which is coupled to the antenna 1802 through the switching unit 1804.

The operation of the transceiver 1800 is controlled by a microprocessor 1842 in known fashion, which interacts with system control components (e.g., user interfaces, memory/storage devices, application programs, operating system software, power control, etc.). In addition, the transceiver 1800 will generally include other circuitry, such as bias circuitry 1846 (which may be distributed throughout the transceiver 1800 in proximity to transistor devices), electrostatic discharge (ESD) protection circuits, testing circuits (not shown), factory programming interfaces (not shown), etc. As should be clear, the bias circuitry 1846 may be modified to incorporate or be coupled to one or more of the bias compensation circuits 1400, 1410, 1600 described above.

In modern transceivers, there are often more than one receiver path Rx and transmitter path Tx, for example, to accommodate multiple frequencies and/or signaling modalities. Further, as should be apparent to one of ordinary skill in the art, some components of the transceiver 1800 may be in a positioned in a different order (e.g., filters) or omitted. Other components can be (and usually are) added (e.g., additional filters, impedance matching networks, variable phase shifters/attenuators, power dividers, etc.).

System-level improvements are specifically enabled by the present invention since many modern RF standards require amplifiers having high linearity. In order to comply with system standards or customer requirements, the current invention may be critical to the overall performance of a transceiver of the type shown in FIG. 18. The current invention therefore specifically defines a system-level embodiment that is creatively enabled by its inclusion in such a system.

Additional Methods

Another aspect of the invention includes methods for adjusting radio frequency amplifier bias as a function of temperature. For example, FIG. 19 is a process flow diagram 1900 of a first method for adjusting radio frequency amplifier bias as a function of temperature. The method steps include: providing one or more amplifier stages, each having a corresponding bias circuit configured to output a corresponding bias current to the corresponding amplifier stage (STEP 1902); and coupling at least one bias compensation circuit to at least one of the bias circuits, the at least one bias compensation circuit including a current mirror circuit having a first transistor coupled to a first constant current source and positioned at a distance d1 from a specific one of the one or more amplifier stages, and a second transistor coupled to a second constant current source and positioned at a distance d2 from that specific one amplifier stage, wherein d1<d2, and each bias compensation circuit regulates the corresponding bias current output by the coupled bias circuits as a function of the temperature of the first transistor relative to the temperature of the second transistor (STEP 1904).

Figure 20:
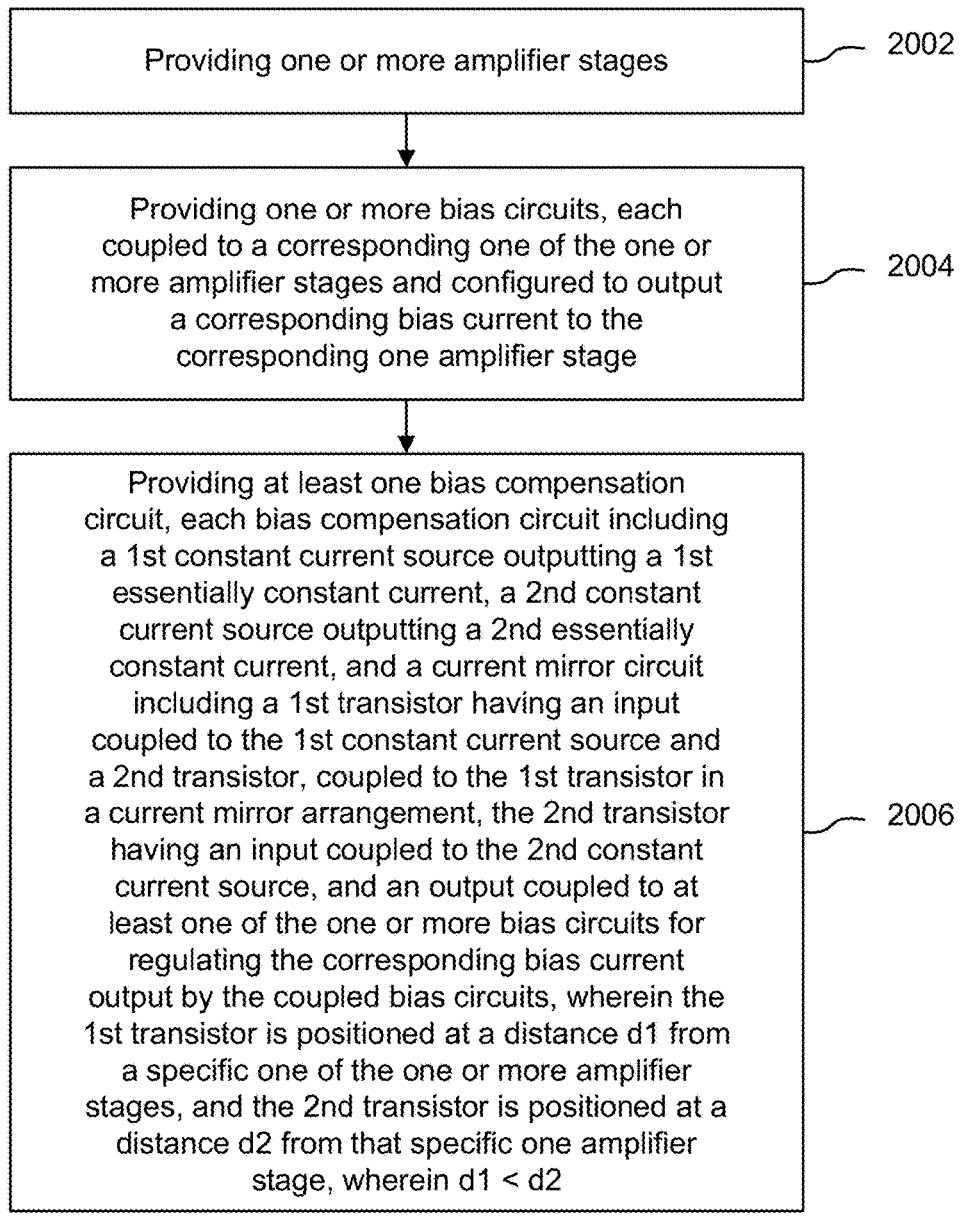
FIG. 20 is a process flow diagram of a second method for adjusting radio frequency amplifier bias as a function of temperature.

As another example, FIG. 20 is a process flow diagram 2000 of a second method for adjusting radio frequency amplifier bias as a function of temperature. The method steps include: providing one or more amplifier stages (STEP 2002); providing one or more bias circuits, each coupled to a corresponding one of the one or more amplifier stages and configured to output a corresponding bias current to the corresponding one amplifier stage (STEP 2004); and providing at least one bias compensation circuit, each bias compensation circuit including a first constant current source outputting a first essentially constant current, a second constant current source outputting a second essentially constant current, and a current mirror circuit including a first transistor having an input coupled to the first constant current source and a second transistor, coupled to the first transistor in a current mirror arrangement, the second transistor having an input coupled to the second constant current source, and an output coupled to at least one of the one or more bias circuits for regulating the corresponding bias current output by the coupled bias circuits, wherein the first transistor is positioned at a distance d1 from a specific one of the one or more amplifier stages, and the second transistor is positioned at a distance d2 from that specific one amplifier stage, wherein d1<d2 (STEP 2006).

Additional aspects of the methods of FIGS. 19 and/or 20 may include one or more of the following: wherein the current mirror circuit regulates the corresponding bias current output by the coupled bias circuits as a function of the temperature of the first transistor relative to the temperature of the second transistor; wherein the first transistor of at least one bias compensation circuit is adjacent the specific one amplifier stage; wherein the specific one amplifier stage from which the first transistor of at least one bias compensation circuit is positioned at a distance d1 generates a greater amount of heat during operation compared to a second amplifier stage; wherein the bias circuit coupled to the second amplifier stage is regulated by at least one bias compensation circuit having a first transistor positioned at a distance d1 from the specific one amplifier stage generating a greater amount of heat during operation compared to the second amplifier stage; wherein the second transistor is positioned farther from every amplifier stage than is the first transistor; wherein the first transistor and the second transistor are bipolar transistors; wherein the current mirror circuit generates a compensation signal δ as a function of the temperature of the first transistor relative to the temperature of the second transistor, and wherein the compensation signal δ regulates the corresponding bias current output by the coupled bias circuits; wherein the bias compensation circuit further includes an output amplifier device, coupled to the current mirror circuit, for generating a compensation signal kδ, as a function of the temperature of the first transistor relative to the temperature of the second transistor, and wherein the compensation signal kδ regulates the corresponding bias current output by the coupled bias circuits, where k is an amplification factor; wherein the regulated bias current output by each coupled bias circuit offsets Gain droop of the amplifier stages coupled to the bias circuit.

Figure 21:
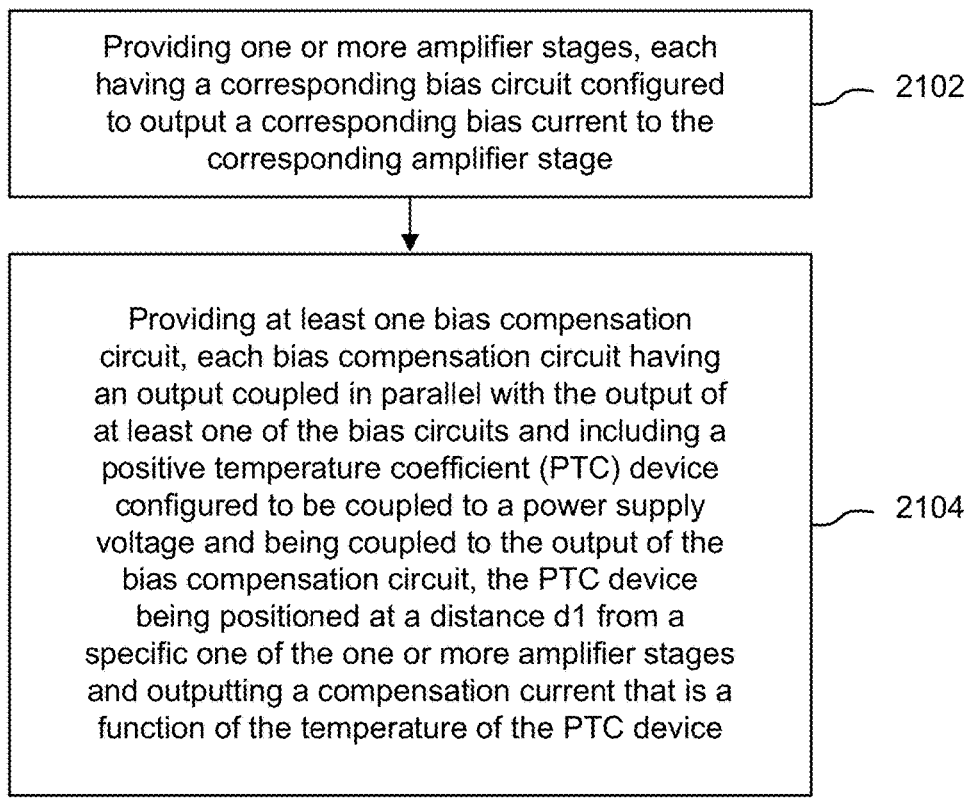
FIG. 21 is a process flow diagram of a third method for adjusting radio frequency amplifier bias as a function of temperature.

As yet another example, FIG. 21 is a process flow diagram of a third method 2100 for adjusting radio frequency amplifier bias as a function of temperature. The method steps include: providing one or more amplifier stages, each having a corresponding bias circuit configured to output a corresponding bias current to the corresponding amplifier stage (STEP 2102); and providing at least one bias compensation circuit, each bias compensation circuit having an output coupled in parallel with the output of at least one of the bias circuits and including a positive temperature coefficient (PTC) device configured to be coupled to a power supply voltage and being coupled to the output of the bias compensation circuit, the PTC device being positioned at a distance d1 from a specific one of the one or more amplifier stages and outputting a compensation current that is a function of the temperature of the PTC device (STEP 2104).

Figure 22:
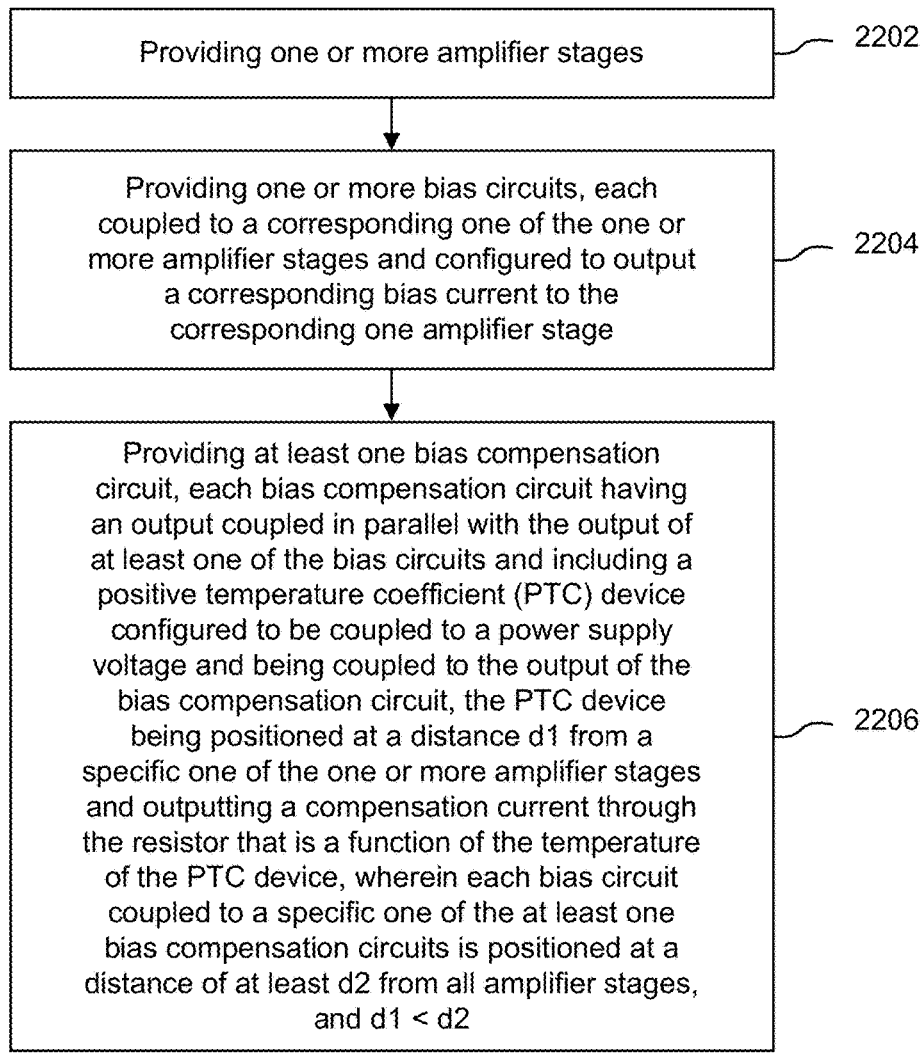
FIG. 22 is a process flow diagram of a fourth method for adjusting radio frequency amplifier bias as a function of temperature.

As still another example, FIG. 22 is a process flow diagram of a fourth method 2200 for adjusting radio frequency amplifier bias as a function of temperature. The method steps include: providing one or more amplifier stages (STEP 2202); providing one or more bias circuits, each coupled to a corresponding one of the one or more amplifier stages and configured to output a corresponding bias current to the corresponding one amplifier stage (STEP 2204); and providing at least one bias compensation circuit, each bias compensation circuit having an output coupled in parallel with the output of at least one of the bias circuits and including a positive temperature coefficient (PTC) device configured to be coupled to a power supply voltage and being coupled to the output of the bias compensation circuit, the PTC device being positioned at a distance d1 from a specific one of the one or more amplifier stages and outputting a compensation current through the resistor that is a function of the temperature of the PTC device, wherein each bias circuit coupled to a specific one of the at least one bias compensation circuits is positioned at a distance of at least d2 from all amplifier stages, and d1<d2 (STEP 2206).

Additional aspects of the methods of FIGS. 21 and/or 22 may include one or more of the following: wherein the compensation current from each bias compensation circuit supplements the bias current output by the bias circuits coupled to such bias compensation circuit as a function of the temperature of the PTC device of such bias compensation circuit relative to the temperature of the bias circuits; wherein the PTC device of at least one bias compensation circuit is adjacent the specific one amplifier stage; wherein the specific one amplifier stage from which the PTC device of at least one bias compensation circuit is positioned at a distance d1 generates a greater amount of heat during operation compared to a second amplifier stage; wherein the output of the bias circuit coupled to the second amplifier stage is coupled to the output of at least one bias compensation circuit having a PTC device positioned at a distance d1 from the specific one amplifier stage generating a greater amount of heat during operation compared to the second amplifier stage; wherein each bias circuit having an output coupled to the output of one of the at least one bias compensation circuits is positioned farther from every amplifier stage than is the PTC device of such coupled bias compensation circuits; further including coupling a resistor between the PTC device and the output of the bias compensation circuit, for regulating the compensation current; wherein the resistor is settable or variable; wherein the compensation current output by a specific one of the at least one bias compensation circuits offsets Gain droop of the amplifier stages coupled to the bias circuits coupled in parallel with the specific one bias compensation circuit; wherein the PTC device is a PTC transistor or a diode; wherein at least one bias circuit has a positive temperature coefficient and outputs a bias current that is a function of the ambient temperature affecting such bias circuit.

The above methods may further include providing a compensation circuit configured to monitor a target circuit having one or more performance parameters affected by self-heating during operation of the target circuit, wherein the compensation circuit is configured to be coupled to and adjust one or more circuit parameters of the target circuit sufficient to substantially offset the effect of self-heating during operation of the target circuit on the one or more performance parameters, the compensation circuit including: at least one sensor located with respect to the target circuit so as to measure the temperature T of the target circuit and generate an output signal representing such temperature T; at least one tracking circuit, each coupled to at least one sensor, configured to capture a temperature $T(t=t_0)$ at a time $t_0$ after the commencement of operation of the target circuit, and to sample a temperature $T(t>t_0)$ at times after time $t_0$ and during operation of the target circuit, the at least one tracking circuit including: a differential amplifier having a first input coupled to the output signal of a corresponding sensor, a second input, and an output representing the difference between signals applied to the first input and the second input; a storage capacitor coupled to the second input of the differential amplifier and selectively coupled to the differential amplifier output; wherein in a first phase, the output of the differential amplifier is coupled to the storage capacitor and to the second input of the differential amplifier, such that a charge on the capacitor represents an initial temperature $T(t=t_0)$, and wherein in a second phase, the output of the differential amplifier represents the difference $\Delta T$ between (i) the output signal of the corresponding sensor coupled to the first input and representing the temperature $T(t>t_0)$, and (ii) the storage capacitor charge coupled to the second input and representing the temperature $T(t=t_0)$; and a correction circuit, coupled to at least one tracking circuit, for generating a correction signal as a function of $\Delta T$ from the coupled at least one tracking circuit, the correction signal being configured to be coupled to and adjust the one or more circuit parameters of the target circuit sufficient to substantially offset the effect of self-heating during operation of the target circuit on the one or more performance parameters.

The above methods may also include providing a compensation circuit configured to monitor a target circuit having one or more performance parameters affected by self-heating during operation of the target circuit, wherein the compensation circuit is configured to be coupled to and adjust one or more circuit parameters of the target circuit sufficient to substantially offset the effect of self-heating during operation of the target circuit on the one or more performance parameters, the compensation circuit including: at least one proximate sensor located relative to the target circuit so as to measure a temperature $T(p)$ of the target circuit; at least one distant sensor located relative to the target circuit so as to measure a temperature $T(d)$; and a comparison and correction circuit, coupled to at least one proximate sensor and at least one distant sensor, for determining $\Delta T=T(p)-T(d)$ and generating a correction signal as a function of $\Delta T$, the correction signal being configured to be coupled to and adjust the one or more circuit parameters of the target circuit sufficient to substantially offset the effect of self-heating during operation of the target circuit on the one or more performance parameters.

Fabrication Technologies and Options

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 1 GHz, and particularly at the common WiFi frequencies of 2.4 GHz and 5 GHz, and even higher frequencies).

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency amplifier including:
   (a) one or more amplifier stages, each having a corresponding bias circuit configured to output a corresponding bias current to the corresponding amplifier stage; and
   (b) at least one bias compensation circuit, each bias compensation circuit coupled to at least one of the bias circuits and including a current mirror circuit having:
      (1) a first transistor coupled to a first constant current source including a variable resistance device in series with a resistor, configured to be coupled to a first source voltage and output a first essentially constant current regardless of fluctuations in the first source voltage, the first transistor positioned at a distance d1 from a specific one of the one or more amplifier stages, and
      (2) a second transistor coupled to a second constant current source including a variable resistance device in series with a resistor, configured to be coupled to a second source voltage and output a second essentially constant current regardless of fluctuations in the second source voltage, the second transistor positioned at a distance d2 from that specific one amplifier stage;
   wherein d1<d2, and each bias compensation circuit regulates the corresponding bias current output by the coupled bias circuits as a function of the temperature of the first transistor relative to the temperature of the second transistor.

2. A radio frequency amplifier including:
   (a) one or more amplifier stages;
   (b) one or more bias circuits, each coupled to a corresponding one of the one or more amplifier stages and configured to output a corresponding bias current to the corresponding one amplifier stage; and
   (c) at least one bias compensation circuit, each bias compensation circuit including:
      (1) a first constant current source outputting a first essentially constant current;
      (2) a second constant current source outputting a second essentially constant current; and
      (3) a current mirror circuit including:
         (A) a first transistor having an input coupled to the first constant current source;
         (B) a second transistor, coupled to the first transistor in a current mirror arrangement, the second transistor having an input coupled to the second constant current source, and an output coupled to at least one of the one or more bias circuits for regulating the corresponding bias current output by the coupled bias circuits;
      wherein the first transistor is positioned at a distance d1 from a specific one of the one or more amplifier stages, and the second transistor is positioned at a distance d2 from that specific one amplifier stage, wherein d1<d2.

3. The invention of claim 2, wherein the current mirror circuit regulates the corresponding bias current output by the coupled bias circuits as a function of the temperature of the first transistor relative to the temperature of the second transistor.

4. The invention of claim 1 or 2, wherein the first transistor of at least one bias compensation circuit is adjacent the specific one amplifier stage.

5. The invention of claim 1 or 2, wherein the specific one amplifier stage from which the first transistor of at least one bias compensation circuit is positioned at a distance d1 generates a greater amount of heat during operation compared to a second amplifier stage.

6. The invention of claim 5, wherein the bias circuit coupled to the second amplifier stage is regulated by at least one bias compensation circuit having a first transistor positioned at a distance d1 from the specific one amplifier stage generating a greater amount of heat during operation compared to the second amplifier stage.

7. The invention of claim 1 or 2, wherein the second transistor is positioned farther from every amplifier stage than is the first transistor.

8. The invention of claim 1 or 2, wherein the first transistor and the second transistor are bipolar transistors.

9. The invention of claim 1 or 2, wherein the current mirror circuit generates a compensation signal $\delta$ as a function of the temperature of the first transistor relative to the temperature of the second transistor, and wherein the compensation signal $\delta$ regulates the corresponding bias current output by the coupled bias circuits.

10. The invention of claim 1 or 2, wherein the bias compensation circuit further includes an output amplifier device, coupled to the current mirror circuit, for generating a compensation signal $k\delta$, as a function of the temperature of the first transistor relative to the temperature of the second transistor, and wherein the compensation signal $k\delta$ regulates the corresponding bias current output by the coupled bias circuits, where k is an amplification factor.

11. The invention of claim 1 or 2, wherein the regulated bias current output by each coupled bias circuit offsets Gain droop of the amplifier stages coupled to the bias circuit.

12. A radio frequency amplifier including:
   (a) one or more amplifier stages;
   (b) one or more bias circuits, each coupled to a corresponding one of the one or more amplifier stages and configured to output a corresponding bias current to the corresponding one amplifier stage; and
   (c) at least one bias compensation circuit, each bias compensation circuit including:
      (1) a first constant current source outputting a first essentially constant current;
      (2) a second constant current source outputting a second essentially constant current; and (3) a current mirror circuit including:
  (A) a first transistor having an input coupled to the first constant current source;
  (B) a second transistor, coupled to the first transistor in a current mirror arrangement, the second transistor having an input coupled to the second constant current source, and an output coupled to at least one of the one or more bias circuits for regulating the corresponding bias current output by the coupled bias circuits;
  wherein the first transistor is positioned at a distance d1 from a specific one of the one or more amplifier stages, and the second transistor is positioned at a distance d2 from that specific one amplifier stage, wherein d1<d2;
the radio frequency amplifier further including a compensation circuit configured to monitor a target circuit having one or more performance parameters affected by self-heating during operation of the target circuit, wherein the compensation circuit is configured to be coupled to and adjust one or more circuit parameters of the target circuit sufficient to substantially offset the effect of self-heating during operation of the target circuit on the one or more performance parameters, the compensation circuit including:
(a) at least one sensor located with respect to the target circuit so as to measure the temperature T of the target circuit and generate an output signal representing such temperature T;
(b) at least one tracking circuit, each coupled to at least one sensor, configured to capture a temperature $T(t=t_0)$ at a time $t_0$ after the commencement of operation of the target circuit, and to sample a temperature $T(t>t_0)$ at times after time $t_0$ and during operation of the target circuit, the at least one tracking circuit including:
  (1) a differential amplifier having a first input coupled to the output signal of a corresponding sensor, a second input, and an output representing the difference between signals applied to the first input and the second input;
  (2) a storage capacitor coupled to the second input of the differential amplifier and selectively coupled to the differential amplifier output;
  wherein:
    (A) in a first phase, the output of the differential amplifier is coupled to the storage capacitor and to the second input of the differential amplifier, such that a charge on the capacitor represents an initial temperature $T(t=t_0)$;
    (B) in a second phase, the output of the differential amplifier represents the difference ΔT between (i) the output signal of the corresponding sensor coupled to the first input and representing the temperature $T(t>t_0)$, and (ii) the storage capacitor charge coupled to the second input and representing the temperature $T(t=t_0)$; and
(c) a correction circuit, coupled to at least one tracking circuit, for generating a correction signal as a function of ΔT from the coupled at least one tracking circuit, the correction signal being configured to be coupled to and adjust the one or more circuit parameters of the target circuit sufficient to substantially offset the effect of self-heating during operation of the target circuit on the one or more performance parameters.

13. A radio frequency amplifier including:
(a) one or more amplifier stages;
(b) one or more bias circuits, each coupled to a corresponding one of the one or more amplifier stages and configured to output a corresponding bias current to the corresponding one amplifier stage; and
(c) at least one bias compensation circuit, each bias compensation circuit including:
  (1) a first constant current source outputting a first essentially constant current;
  (2) a second constant current source outputting a second essentially constant current; and
  (3) a current mirror circuit including:
    (A) a first transistor having an input coupled to the first constant current source;
    (B) a second transistor, coupled to the first transistor in a current mirror arrangement, the second transistor having an input coupled to the second constant current source, and an output coupled to at least one of the one or more bias circuits for regulating the corresponding bias current output by the coupled bias circuits;
    wherein the first transistor is positioned at a distance d1 from a specific one of the one or more amplifier stages, and the second transistor is positioned at a distance d2 from that specific one amplifier stage, wherein d1<d2;
the radio frequency amplifier further including a compensation circuit configured to monitor a target circuit having one or more performance parameters affected by self-heating during operation of the target circuit, wherein the compensation circuit is configured to be coupled to and adjust one or more circuit parameters of the target circuit sufficient to substantially offset the effect of self-heating during operation of the target circuit on the one or more performance parameters, the compensation circuit including:
(a) at least one proximate sensor located relative to the target circuit so as to measure a temperature T(p) of the target circuit;
(b) at least one distant sensor located relative to the target circuit so as to measure a temperature T(d); and
(c) a comparison and correction circuit, coupled to at least one proximate sensor and at least one distant sensor, for determining ΔT=T(p)−T(d) and generating a correction signal as a function of ΔT, the correction signal being configured to be coupled to and adjust the one or more circuit parameters of the target circuit sufficient to substantially offset the effect of self-heating during operation of the target circuit on the one or more performance parameters.

\* \* \* \* \*